United States Patent
Takeuchi

(10) Patent No.: US 10,727,157 B2
(45) Date of Patent: Jul. 28, 2020

(54) ELECTRICAL POWER CONVERSION DEVICE

(71) Applicant: DENSO CORPORATION, Kariya, Aichi-pref. (JP)

(72) Inventor: Kazuya Takeuchi, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 15/916,699

(22) Filed: Mar. 9, 2018

(65) Prior Publication Data
US 2018/0261527 A1    Sep. 13, 2018

(30) Foreign Application Priority Data

Mar. 9, 2017   (JP) .................. 2017-045011

(51) Int. Cl.
*H01L 23/427*   (2006.01)
*H01L 23/28*    (2006.01)
(Continued)

(52) U.S. Cl.
CPC ............ *H01L 23/427* (2013.01); *H01L 23/28* (2013.01); *H01L 23/4012* (2013.01);
(Continued)

(58) Field of Classification Search
CPC ...... F28F 3/025; H01L 23/473; H01L 25/072; H01L 24/33
See application file for complete search history.

(56) References Cited

U.S. PATENT DOCUMENTS

2001/0033477 A1* 10/2001 Inoue ................. H01L 23/4006
                                                    361/718
2007/0085197 A1*  4/2007 Arai .................... H01L 23/473
                                                    257/712
(Continued)

FOREIGN PATENT DOCUMENTS

JP   2007-173372 A       7/2007
JP   2007173372 A  *     7/2007  ............ H01L 24/33
(Continued)

OTHER PUBLICATIONS

Machine translation of JP 2010153527 A (Year: 2010).*
JP2007173372A Original document with English machine translation. pdf (Year: 2007).*

*Primary Examiner* — Brian Turner
(74) *Attorney, Agent, or Firm* — Oliff PLC

(57) ABSTRACT

An electrical power conversion device is provided which includes a stack of semiconductor modules and a plurality of cooling pipes. Each of the cooling pipes includes a first and a second outer shell plate which are electrically conductive. Each of the outer shell plates includes a flow-path defining portion which defines a coolant flow path between the outer shell plates and a flow-path outer periphery forming a circumference of the flow-path defining portion. The flow-path outer periphery of at least one of the outer shell plates has formed thereon an outer shell protrusion which is laid to overlap power terminals or control terminals extending from the semiconductor module to cancel a magnetic flux, as developed around the power terminals or the control terminals, thereby decreasing the inductance of the power terminals or the control terminals.

11 Claims, 16 Drawing Sheets

(51) Int. Cl.
  *H02M 7/537* (2006.01)
  *H05K 7/20* (2006.01)
  *H01L 23/473* (2006.01)
  *H02M 7/162* (2006.01)
  *H01L 23/40* (2006.01)
  *H02M 7/00* (2006.01)
  *H01L 23/367* (2006.01)
  *H01L 23/31* (2006.01)
  *H02M 1/32* (2007.01)

(52) U.S. Cl.
  CPC .......... *H01L 23/473* (2013.01); *H02M 7/003* (2013.01); *H01L 23/3107* (2013.01); *H01L 23/3672* (2013.01); *H01L 2224/33* (2013.01); *H02M 2001/327* (2013.01)

(56) References Cited

U.S. PATENT DOCUMENTS

| | | | | |
|---|---|---|---|---|
| 2009/0107655 | A1* | 4/2009 | Kajiura | F28F 3/025 165/80.3 |
| 2011/0316143 | A1* | 12/2011 | Noritake | H01L 21/565 257/713 |
| 2012/0087095 | A1* | 4/2012 | Tokuyama | B60L 50/61 361/721 |
| 2013/0058068 | A1* | 3/2013 | Funatsu | H05K 7/20927 361/820 |
| 2014/0003111 | A1* | 1/2014 | Ichijo | H02M 1/00 363/141 |
| 2014/0118909 | A1* | 5/2014 | Matsuno | H02M 7/003 361/679.01 |
| 2016/0211193 | A1* | 7/2016 | Mizuno | H01L 23/40 |
| 2017/0265337 | A1* | 9/2017 | Lei | H02M 7/003 |

FOREIGN PATENT DOCUMENTS

| | | | |
|---|---|---|---|
| JP | 2009-021404 A | 1/2009 | |
| JP | 2010153527 A * | 7/2010 | ............. H01L 24/01 |
| JP | 2011-009462 A | 1/2011 | |
| JP | 2017-022844 A | 1/2017 | |
| JP | 2018-060863 A | 4/2018 | |

* cited by examiner

ELECTRICAL POWER CONVERSION DEVICE

CROSS REFERENCE TO RELATED DOCUMENT

The present application claims the benefit of priority of Japanese Patent Application No. 2017-45011 filed on Mar. 9, 2017 the disclosure of which is incorporated herein by reference.

BACKGROUND

1 Technical Field

The invention relates generally to a power converter equipped with semiconductor modules and cooling pipes.

2 Background Art

Typically, electrical power conversion devices, such as inverters or converters, are equipped with semiconductor modules in which semiconductor devices are installed. The semiconductor modules are usually designed to have a plurality of power terminals and a plurality of control terminals extending outside a module body. The power terminals are connected to a bus bar. The control terminals are connected to a control circuit board. These arrangements form an electric current loop including the power terminals and an electric current loop including the control terminals.

The current loop has a parasitic inductance. It is, therefore, desirable to reduce the inductance of the power terminals or the control terminals in order to decrease switching surge or switching loss in the semiconductor module.

Japanese Patent First Publication No. 2007-173372 discloses an electrical power conversion device is equipped with semiconductor modules and cooling pipes working to cool the semiconductor modules. Each of the cooling pipes has an intermediate plate extending outside the cooling pipe in order to enhance efficiency in reducing a rise in temperature in the electrical power conversion device. Specifically, each of the cooling pipes has a pair of outer shell plates and an intermediate plate disposed between the outer shell plates. The intermediate plate extends outside the outer shell plates.

The above electrical power conversion device still has room for improvement as discussed below.

The intermediate plate has a portion which protrudes outside the outer shell plates and overlaps the power terminals or the control terminals in a direction in which the semiconductor modules are stacked (which will also be referred to below as a stacking direction). The protrusion of the intermediate plate serves to reduce the inductance of the power terminals or the control terminals as well as to minimize a rise in temperature in the electrical power conversion device. Specifically, a current loop through which an electrical current flows through the power terminals creates a magnetic flux which passes through the protrusion and changes with time, thereby developing an eddy current flowing in the protrusion. The eddy current is directed to cancel the magnetic flux, thereby reducing the inductance of the power terminals. The same beneficial advantage is also offered in a case where the protrusion is laid to face the control terminals.

The protrusion is, however, formed by a portion of the intermediate plate, thus resulting in a difficulty in placing the protrusion closer to the power terminals or the control terminals, which may lead to insufficient reduction in the inductance.

Most of the intermediate plate is disposed inside the cooling pipe. The intermediate plate is, thus, usually made of a thin plate, which may result in a lack in mechanical strength of the protrusion of the intermediate plate. There is, therefore, a risk that the protrusion is undesirably deformed when the electrical power conversion device is produced or maintained, which adversely impinges on the production of the electrical power conversion device. There is, therefore, still room for improvement of the productivity of the electrical power conversion device.

When the protrusion extends in a direction different from a direction in which the power terminals or the control terminals extend, it does not ensure the reduction in inductance of the power terminals or the control terminals and also leads to a factor of increasing the size of the electrical power conversion device.

SUMMARY

It is therefore an object of this disclosure to provide an electrical power conversion device which is designed to enhance a reduction in the inductance, improve productivity thereof, and enables to be reduced in size thereof.

According to one aspect of the invention, there is provided an electrical power conversion apparatus which comprises: (a) a semiconductor module which includes a module body in which a semiconductor device is installed, a plurality of power terminals extending from the module body, and a plurality of control terminals extending from the module body, the module body having major surfaces; and (b) a first and a second cooling pipe which are stacked on each other through the semiconductor module and hold the major surfaces of the module body therebetween.

The power terminals extend from the module body in a first height-wise direction that is one of height-wise directions perpendicular to a stacking direction in which the first and second cooling pipes and the semiconductor module are stacked.

The control terminals extend from the module body in a second height-wise direction that is one of the height-wise directions.

Each of the first and second cooling pipes includes a first and a second outer shell plate which are electrically conductive and face each other in the stacking direction. The first and second outer shell plates form a coolant flow path therebetween.

Each of the first and second outer shell plates includes a flow-path defining portion which defines the coolant flow path and a flow-path outer periphery which forms an outer circumference of the flow-path defining portion, as viewed in the stacking direction.

The flow-path outer periphery of at least one of the first and second outer shell plates includes an outer shell protrusion located on one of sides of the flow-path defining portion in the height-wise directions.

The outer shell protrusion has a protruding dimension that is a distance between an outer edge of the outer shell protrusion and an outer edge of the flow-path defining portion is selected to be greater than a protruding dimension of a circumferential side portion of the flow-path outer periphery which protrudes outwardly from the flow-path defining portion in a lateral direction perpendicular to the height-wise directions and the stacking direction.

The outer shell protrusion is laid to overlap the power terminals or the control terminals in the stacking direction.

The electrical power conversion device is, as described above, designed to have the outer shell protrusion overlapping the power terminals or the control terminals in the stacking direction. This causes the outer shell protrusion to develop an eddy current when an electrical current flows through the power terminals or the control terminals. The eddy current serves to cancel a magnetic flux arising from a current loop of the eddy current, thereby resulting in a decrease in inductance of the power terminals or and the control terminals facing the outer shell protrusion.

The outer shell protrusion is formed by a portion of the outer shell plate. Thus enables the outer shell protrusion to be disposed close to the power terminals or the control terminals in the stacking direction.

Each of the first and second outer shell plates constituting the cooling pipe is designed to have a relatively great thickness. The outer shell protrusion made of a portion of the outer shell plate, thus, have a relatively great thickness, thereby ensuring a desired mechanical strength of the outer shell protrusion. This minimizes a risk of undesirable deformation of the outer shell protrusion, which improves the productivity of the electrical power conversion device.

The protruding dimension of the outer shell protrusion from the flow-path defining portion is selected to be greater than the protruding dimension of the circumferential side portion. This minimizes the dimension of the cooling pipe in the lateral direction. In other words, the outer shell protrusion does not result in an increase in dimension of the cooling pipe in the lateral direction, thereby facilitating the ease with which the electrical power conversion device is reduced in size thereof.

As apparent from the above discussion, the electrical power conversion device is designed to decrease the inductance of the power terminals or the control terminals, improve the productivity thereof, and enable the size thereof to be reduced.

Symbols in brackets represent correspondence relation between terms in claims and terms described in embodiments which will be discussed later, but are not limited only to parts referred to in the disclosure.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings.

DESCRIPTION OF THE PREFERRED EMBODIMENTS

First Embodiment

Figure 1:
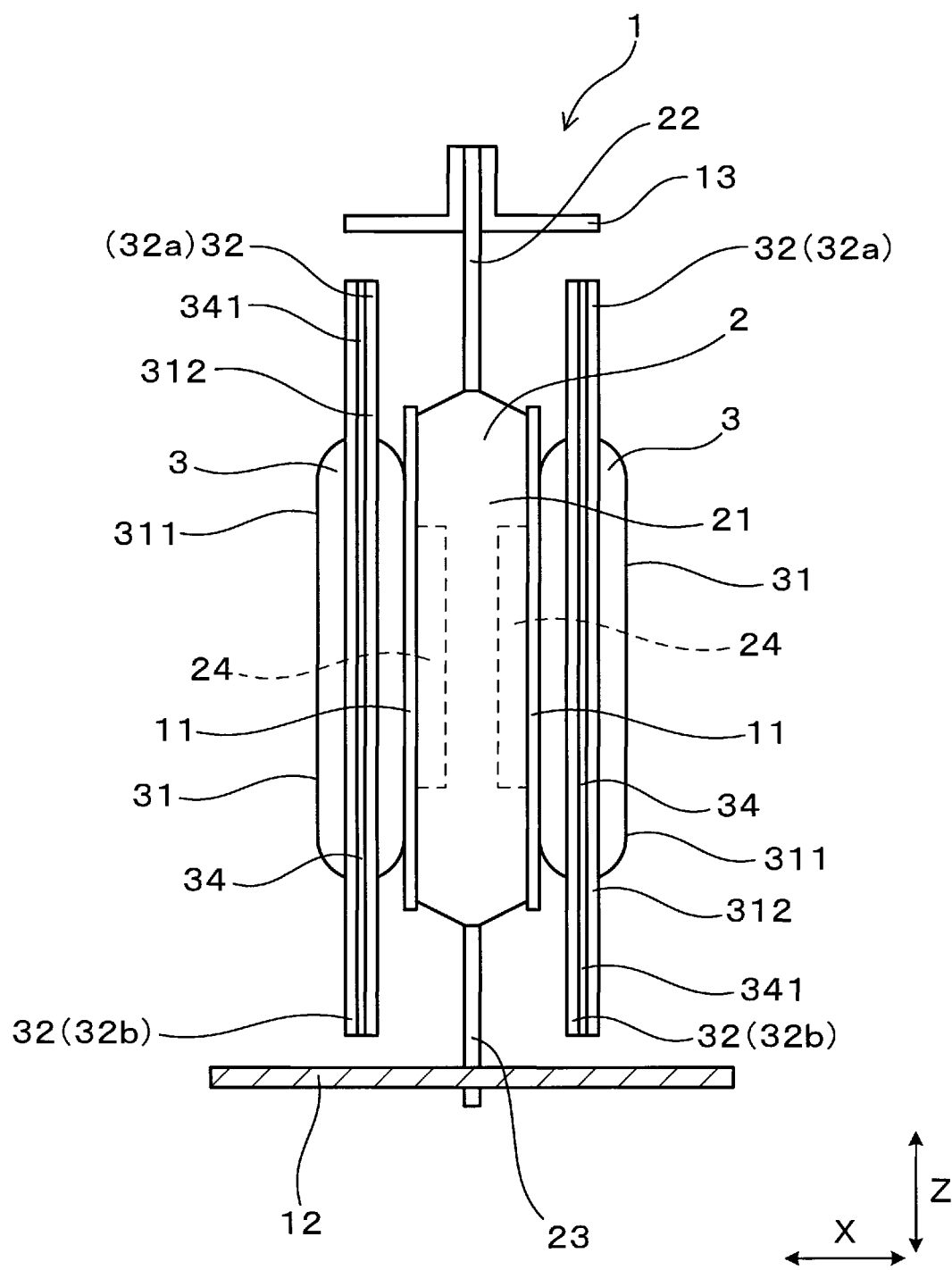
FIG. 1 is a partial side view which illustrates an electrical power conversion device according to the first embodiment.
Figure 2:
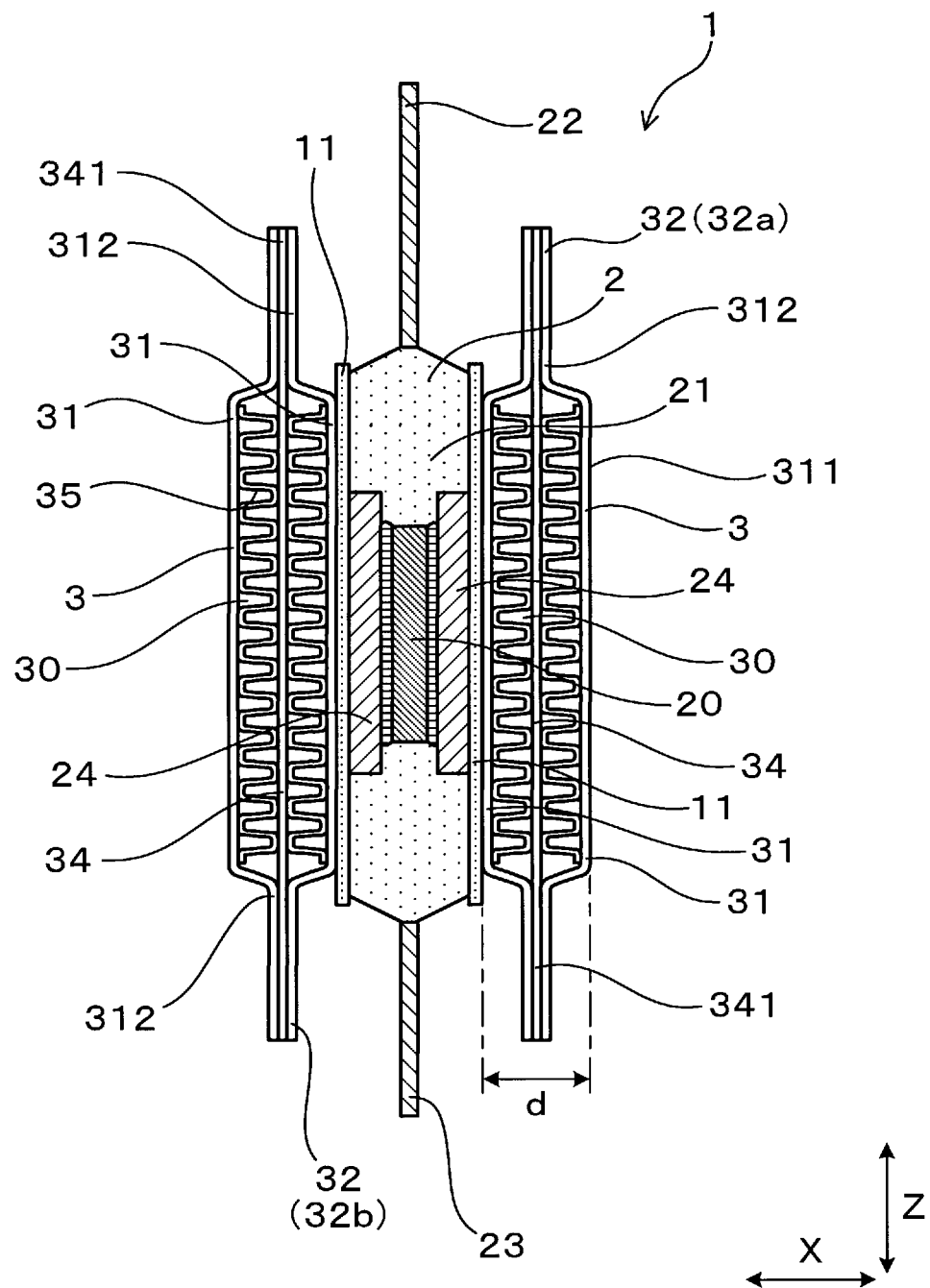
FIG. 2 is a plan view which illustrates a semiconductor module and a cooler in the first embodiment.
Figure 3:
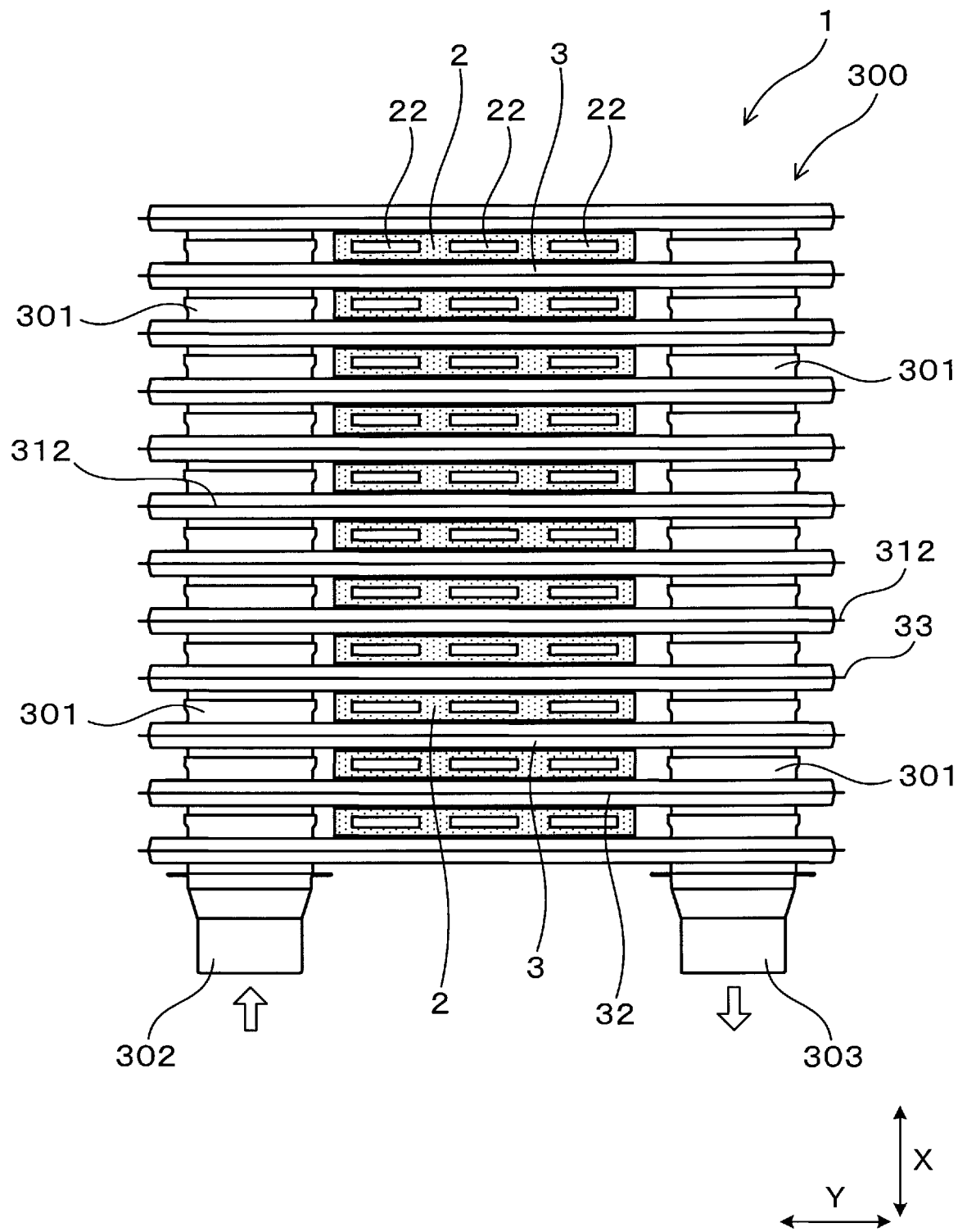
FIG. 3 is a plan view which illustrates a stack of semiconductor modules and cooling pipes in the first embodiment.

Referring now to the drawings, wherein like reference numbers will refer to like parts throughout the several views, particularly to FIGS. 1 to 9, there is shown the electrical power conversion device 1 according to the first embodiment. The electrical power conversion device 1 is, as illustrated in FIGS. 1 to 3, equipped with the semiconductor modules 2 and a plurality of cooling pipes (i.e., cooling tubes) 3 which are stacked to hold major opposed surfaces of each of the semiconductor modules 2 therebetween.

Figure 4:
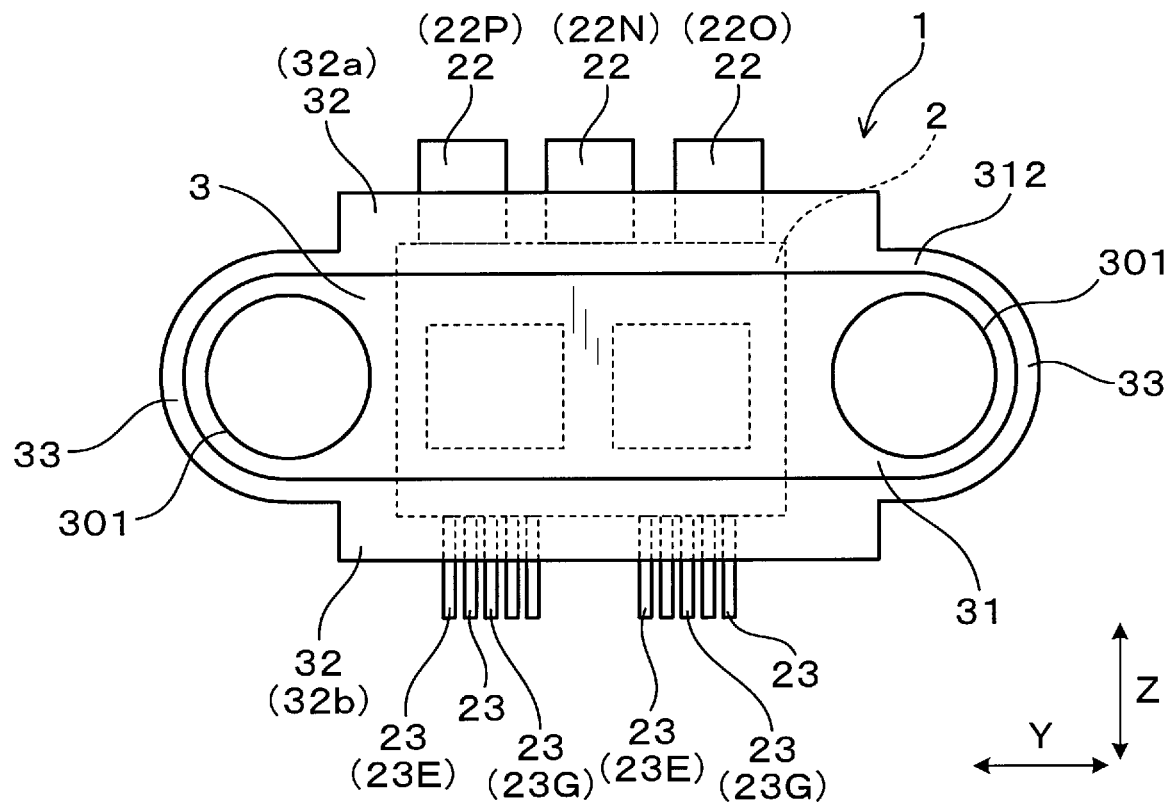
FIG. 4 is a front view which illustrates a semiconductor module and a cooling pipe in the first embodiment.
Figure 5:
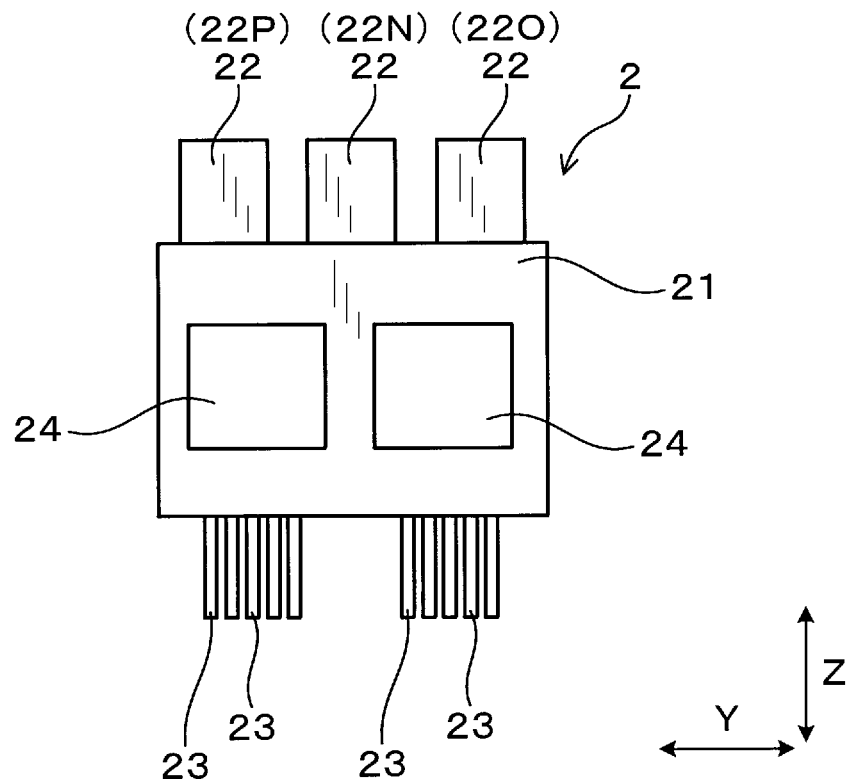
FIG. 5 is a front view which illustrates a semiconductor module in the first embodiment.

Each of the semiconductor module 2 is, as illustrated in FIGS. 2, 4, and 5, equipped with the module body 21 in which the semiconductor device 20 is installed, a plurality of power terminals 22 protruding from the module body 21, and a plurality of control terminals 23 protruding from the module body 21.

The power terminals 22 extend from the module body 21 in the same one of height-wise directions Z of the electrical power conversion device 1. The control terminals 23 extend from the module body 21 in the same one of the height-wise directions Z.

The height-wise directions Z are directions perpendicular to a stacking direction X that is direction in which the cooling pipes 3 and the semiconductor module 2 are stacked. The height-wise directions Z are oriented parallel to directions in which the power terminals 22 and the control terminals 23 protrude from the module body 21 (i.e., a lengthwise direction of the power terminals 22 and the control terminals 23). A direction perpendicular both to the stacking direction X and the height-wise directions Z will also be referred to as a lateral direction Y. The lateral direction Y are the height-wise directions Z are defined for convenience sake and do not specify orientation of the electrical power conversion device 1. The orientation of the electrical power conversion device 1 may be changed depending upon the type of usage thereof.

Figure 6:
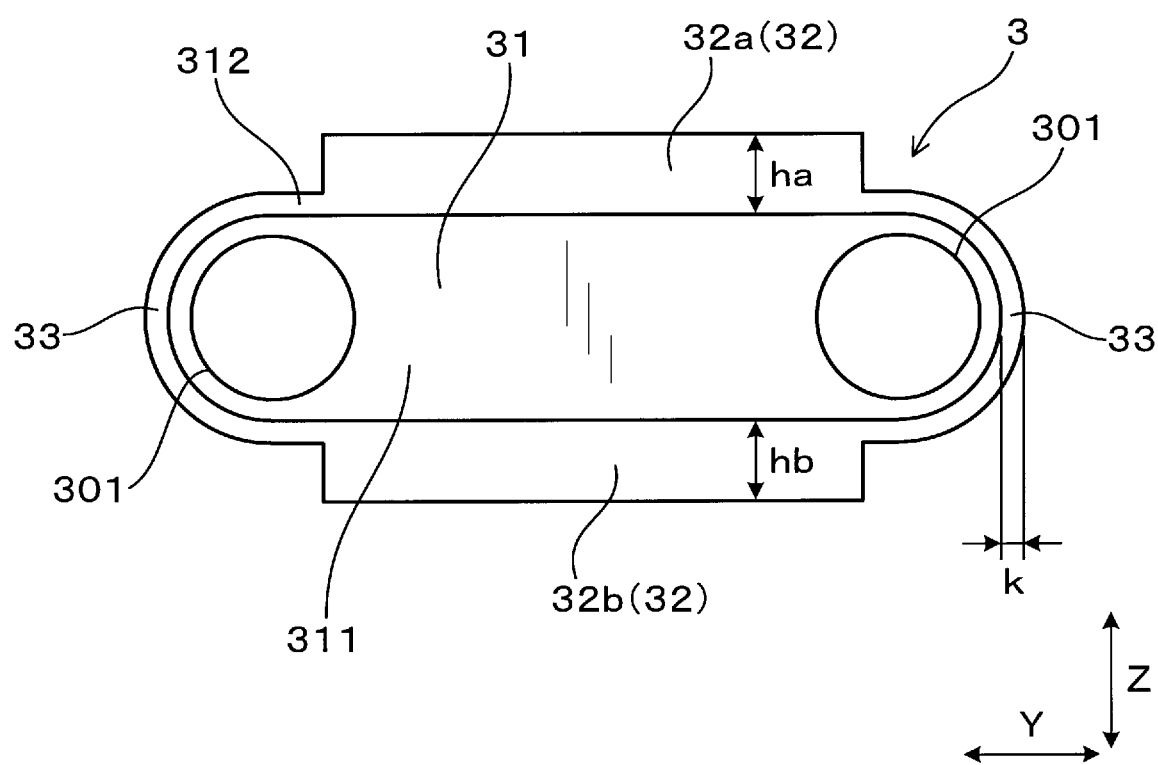
FIG. 6 is a front view which illustrates a cooling pipe in the first embodiment.
Figure 7:
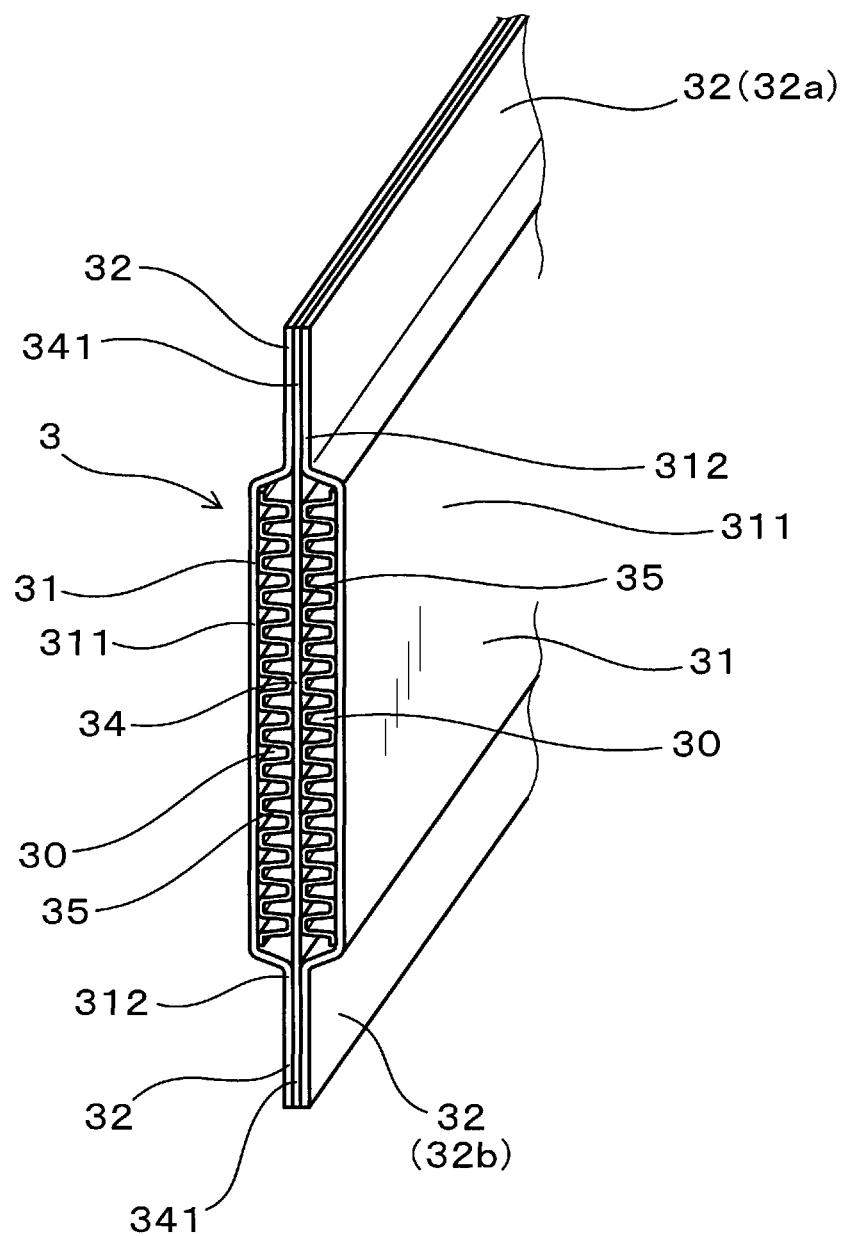
FIG. 7 is a perspective sectional view which illustrates a cooling pipe in the first embodiment.

Each of the cooling pipes 3 is, as illustrated in FIGS. 2 and 7, equipped with a pair of outer shell plates 31 (which will also be referred to below as a first and a second outer shell plate) which face each other, in other words, are opposed to each other in the stacking direction X and are made of electrical conductive material. Each of the cooling pipes 3 has the coolant flow path 30 between the outer shell plates 31. Each of the outer shell plates 31 is, as illustrated in FIGS. 2, 6, and 7, equipped with the flow-path defining portion 311 and the flow-path outer periphery 312. The flow-path defining portion 311 defines the coolant flow path 30 between the adjacent outer shell plates 31. The flow-path outer periphery 312 forms an outer circumference of the flow-path defining portion 311, as viewed from the stacking direction X.

The flow-path outer periphery 312 of at least one of the pair of the outer shell plate 31 may be designed to have the outer shell protrusion 32 extending or protruding in one of the height-wise directions Z. In this embodiment, each of the outer shell plates 31, as clearly illustrated in FIGS. 4 and 7, has the outer shell protrusion 32. Specifically, the outer shell plate 31 has the outer shell protrusions 32 formed on sides of the flow-path defining portion 311 which are opposed to each other in the height-wise direction Z. Each pair of outer shell plates 31 has the outer shell protrusions 32 whose major surfaces face each other in the stacking direction X.

The widths ha and hb of the outer shell protrusions 32 that are, as shown in FIG. 6, dimensions or distances between outer edges (i.e., side edges) of the flow-path defining portion 311 and outer edges (i.e., side edges) of the outer shell protrusions 32 (which will also be referred to as protruding dimension below) in the height-wise direction Z are selected to be greater than the thickness d of the cooling pipe 3, as defined in the stacking direction X, in FIG. 2. Each of the widths ha and hb is also selected to be greater than the width k of each of the circumferential side portions 33 of the flow-path outer periphery 312, as defined in the lateral direction Y. Each of the circumferential side portions 33 is a portion of the flow-path outer periphery 312 which extends between side edges of the outer shell protrusions 32 and protrudes outwardly from the flow-path defining portion 311 in the lateral direction Y. In other words, the width k (which will also be referred to below as a protruding dimension) is a dimension of the circumferential side portion 33, that is, a distance between the outer circumference of the flow-path defining portion 311 and the outer edge of each of the circumferential side portions 33 in the lateral direction Y. Each of the outer shell protrusions 32 is laid to overlap the power terminals 22 or the control terminals 23 in the stacking direction X.

Each of the semiconductor module 2 is designed to have the power terminals 22 extending from a main body thereof in one of the height-wise directions Z and the control terminals 23 extending form the main body in a direction opposite the direction in which the power terminals 22 extend. Each of the outer shell plates 31 has the outer shell protrusions 32 extending therefrom in opposite directions, i.e., the height-wise directions Z, respectively. Specifically, the outer shell protrusions 32 includes the outer shell protrusion 32a and the outer shell protrusion 32b (which will also be referred to below as first and second outer shell protrusions). The outer shell protrusion 32a extending from one of the side edges of each of the outer shell plates 31 toward the power terminals 22 is laid to physically overlap the power terminals 22 in the stacking direction X. The outer shell protrusion 32b extending from the other side edge of each of the outer shell plates 31 toward the control terminals 23 is laid to physically overlap the control terminals 23 in the stacking direction X.

In this disclosure, the direction in which the power terminals 22 extend from the module body 21 of each of the semiconductor modules 2 in one of the height-wise directions Z is also referred to as an upper side or upward direction, while a direction opposite to such a direction is also referred to as a lower side or downward direction. These directions are, however, used only for the sake of convenience regardless of orientation of the electrical power conversion device 1 when actually used.

The width ha of each of the outer shell protrusions 32a, in other words, a distance by which the outer shell protrusion 32a extends in the upward direction may be identical with or different from the width hb of each of the outer shell protrusions 32b, in other words, a distance by which the outer shell protrusion 32b extend in the downward direction. The width k of each of the circumferential side portions 33 is smaller than the thickness d of each of the cooling pipe 3 in the stacking direction X.

The power terminals 22 of each of the semiconductor modules 2 are, as clearly illustrated in FIGS. 3 to 5, are aligned in the lateral direction Y. Similarly, the control terminals 23 of each of the semiconductor modules 2 are aligned in the lateral direction Y. The adjacent power terminals 22 are arranged away from each other in the lateral direction Y. In other words, there is a void space or region between each two adjacent power terminals 22 in the lateral direction Y. The outer shell protrusions 32a face the void regions in the stacking direction X. In other words, each of the outer shell protrusions 32a extends continuously in the lateral direction Y and overlap all the power terminals 22 which are spaced apart from each other in alignment in the lateral direction Y.

Similarly, each of the outer shell protrusions 32b extends continuously in the lateral direction Y and overlap all the control terminals 23 which are spaced apart from each other in alignment in the lateral direction Y.

In this embodiment, each of the outer shell protrusions 32 does not extend in the height-wise direction Z from an entire length of one of the cooling pipes 3 in the lateral direction Y, but extends from a portion of the length of the cooling pipe 3. Each of the outer shell protrusions 32 may alternatively be designed to extend continuously along the entire length of the cooling pipe 3 in the lateral direction Y.

Each of the cooling pipes 3 is, as clearly illustrated in FIGS. 2 and 7, equipped with the intermediate plate 34 interposed between the outer shell plates 31 thereof. The intermediate plate 34 is firmly held at end portions thereof by the flow-path outer peripheries 312 of the outer shell plates 31. The intermediate plate 34 has intermediate protrusions 341 overlapping the outer shell protrusions 32.

The intermediate plate 34 is made of a flat plate with two opposed major surfaces. The intermediate plate 34 is sandwiched at the major surfaces thereof by the outer shell plate 31 and welded together. The intermediate plate 34 and each of the outer shell plates 31 define the coolant flow path 30 therebetween. The corrugated inner fins 35 are disposed between the intermediate plate 34 and the respective outer shell plates 31.

The outer shell plates 31, the intermediate plate 34, and the inner fins 35 are each made of a metallic plate such as an aluminum alloy plate. The intermediate plate 34 is smaller in thickness than the outer shell plates 31. For example, the thickness of the intermediate plate 34 may be selected to be less than or equal to half the thickness of the outer shell plate 31. The thickness of the inner fins 35 is also smaller than that of the outer shell plates 31. The thickness of the inner fins 35 may be selected to be less than or equal to that of the intermediate plate 34.

The outer shell plates 31, the intermediate plate 34, and the inner fins 35 are jointed together by brazing or welding. The outer shell plates 31 and the intermediate plate 34 are joined together at the flow-path outer periphery 312. Each of the outer shell protrusions 32 and a corresponding one of the intermediate protrusions 341 may be joined together at opposed entire surfaces thereof or alternatively be merely laid on one another without being joined together. When viewed in the stacking direction X, the joint of the flow-path outer periphery 312 to the intermediate plate 34 continuously extends around an entire circumference of the coolant flow path 30.

The coolant flow path 30 is designed to have a cooling medium, such as water, flowing therethrough. The cooling medium may alternatively be a natural cooling medium, such as ammonia, water with which ethylene glycol anti-freezing fluid is mixed, fluorocarbon cooling medium, such as Fluorinert, fluorocarbon cooling medium, such as HCFC-123 or HFC-134a, alcohol cooling medium, such as methanol or alcohol, or ketone-based cooling medium, such as acetone.

The insulator 11 is, as clearly illustrated in FIGS. 1 and 2, disposed between each of the cooling pipes 3 and the semiconductor module 2. The insulator 11 is made of a ceramic plate which has a higher thermal conductivity. The insulator 11 and the cooling pipe are stacked on each of opposed major surfaces of the semiconductor module 2 (i.e., opposed major surfaces of the module body 21). In other words, the two adjacent cooling pipes 3 (which will also be referred to below as a first and a second cooling pipe) hold the major surfaces of the module body 21 of each of the semiconductor modules 2 therebetween through the insulators 11. The insulators 11 may be omitted. The semiconductor module 2 has heat radiating plates 24 exposed to the major surfaces thereof. The insulators 11 are mounted through grease, not shown, in contact with the major surfaces of the semiconductor module 2 to which the heat radiating plates 24 are exposed. The cooling pipe 3 is arranged in contact with each of the insulators 11 through grease, not shown.

The semiconductor module 2 is further stacked, as clearly illustrated in FIG. 3, through the insulator 11 on the above assembly of the semiconductor 2 and the insulators 11. Specifically, the cooling pipes 3, the semiconductor modules 2, and the insulators 11 (not shown in FIG. 3) are alternately stacked into the form illustrated in FIG. 3. FIG. 3 omits the insulators 11 for the sake of simplicity of illustration.

The cooling pipes 3 which are disposed adjacent each other in the stacking direction X are, as clearly illustrated in FIG. 3, joined together using the connecting pipes 301 at ends thereof spaced apart from each other in the lateral direction Y. Each of the connecting pipes 301 fluidically connects between the coolant flow paths 30 of the adjacent cooling pipes 3.

The cooling pipes 3 are, as described above, stacked in the form of a cooling pipe assembly shown in FIG. 3. The cooling pipe assembly has ends opposed to each other in the stacking direction X. The cooling pipe 3 which is arranged at one of the ends of the cooling pipe assembly has the cooling medium inlet 302 and the cooling medium outlet 303. The cooling pipes 3 are physically arranged parallel to each other and joined together in this way to form the cooler 300 in which each of the semiconductor modules 2 is disposed between respective adjacent two of the cooling pipes.

The power terminals 22 of the semiconductor modules 2, as illustrated in FIGS. 1, 2, and 4, protrude above the cooling pipes 3 in the height-wise direction Z and connect with the bus bars 13 disposed above the cooling pipes 3. The control terminals 23 protrude below the cooling pipes 3 in the height-wise direction Z and connect with the control circuit board 12 mounted beneath the cooling pipes 3. The controller circuit board 12, as can be seen in FIG. 1, has a major surface which is oriented to have a normal line extending in the height-wise direction Z. The controller circuit board 12 has formed therein through-holes into which the control terminals 23 are inserted and then joined using, for example, soldering to the controller circuit board 12.

The electrical power conversion device 1 may be used as an inverter which perform power conversion between a dc power supply and a three-phase electrical rotating machine. In this embodiment, the semiconductor module 2 has disposed therein two switching devices which, as illustrated in FIG. 8, work as an upper arm switching device 2u and a lower arm switching device 2d which are connected in series.

Figure 8:
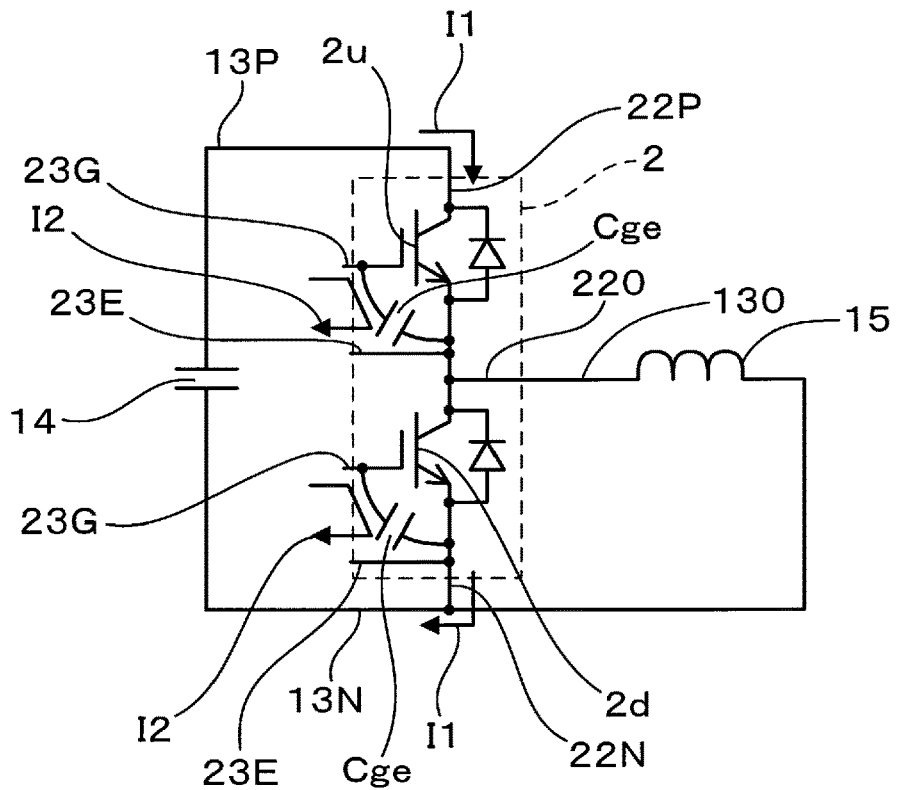
FIG. 8 is a circuit diagram which partially illustrates a circuit structure of an electrical power conversion device in the first embodiment.

FIG. 8 is a schematic circuit diagram which demonstrates the smoothing capacitor 14, the semiconductor module 2, and the coil 15 for each phase of the electrical rotating machine. The smoothing capacitor 14 is connected between the high-potential bus bar 13P and the low-potential bus bar 13N. The coil 15 is connected to the semiconductor module 2. The capacitance Cge denoted in FIG. 8 represents a parasitic capacitance of each of the switching devices 2.

The switching devices 2u and 2d of each of the semiconductor modules 2 are made of an IGBT (Insulated Gate Bipolar Transistor). Each of the upper arm switching device 2u and the lower arm switching device 2d has a flywheeling diode connected in inverse-parallel thereto. A joint between the upper arm switching device 2u and the lower arm switching device 2d is connected to one of electrodes of the electrical rotating machine. The switching devices 2u and 2d may alternatively be implemented by a MOSFET (i.e., metal-oxide-semiconductor field-effect transistor).

Each of the semiconductor modules 2 is, as illustrated in FIG. 5, equipped with three power terminals 22P, 22N, and 22O which will also be generally denoted by reference numeral 22. The power terminal 22P is, as shown in FIG. 8, electrically connected to a collector of the upper arm switching device 2u. The power terminal 22N is electrically connected to an emitter of the lower arm switching device 2d. The power terminal 22O is electrically connected to the emitter of the upper arm switching device 2u and the collector of the lower arm switching device 2d. The power terminal 22P is electrically connected to the high-potential bus bar 13P leading to the positive terminal of the dc power supply. The power terminal 22N is electrically connected to the low-potential bus bar 13N leading to the negative terminal of the dc power supply. The power terminal 22O is electrically connected to the output bus bar 13O leading to the electrical rotating machine.

The semiconductor module 2 is equipped with the control terminals 23 for the upper arm switching device 2u and the control terminals 23 for the lower arm switching device 2d. Specifically, the control terminals 23 include control terminals 23G connected to the gates of the switching devices 2u and 2d and control terminals 23E connected to the emitters of the switching devices 2u and 2d.

The electrical power conversion device 1 works to selectively turn on or off the switching devices 2u and 2d to achieve power conversion. This causes a controlled current to be changed in a closed loop which is, as illustrated in FIG. 8, made up of the upper arm switching device 2u and the lower arm switching device 2d connected in series and the smoothing capacitors 14. It is, therefore, desirable to decrease the inductance in the closed loop.

Figure 9:
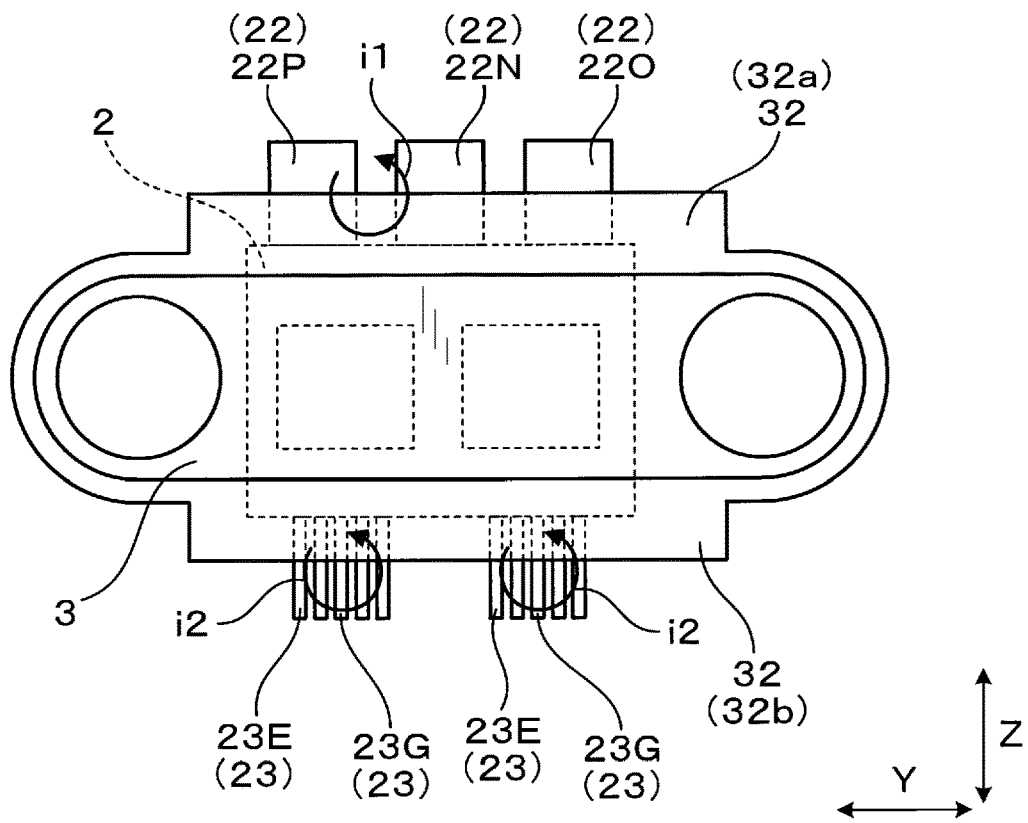
FIG. 9 is an explanatory view which demonstrates current loops created in a semiconductor module in the first embodiment.

Specifically, an alternating current component I1 of the controlled current varying in the closed loop, as can be seen in FIG. 8, flows in opposite directions in the power terminal 22P and the power terminal 22N. This forms, as illustrated in FIG. 9, a current loop i1 including the power terminal 22P and the power terminal 22N arranged adjacent each other.

The current loop i1 creates a magnetic flux in the stacking direction X. The outer shell protrusion 32, as described above, faces the power terminal 22P and the power terminal 22N, thereby causing an eddy current to be developed in the outer shell protrusion 32 to cancel the magnetic flux produced by the current loop i1, which results in a decrease in inductance of the power terminals 22.

Similarly, currents I2, as clearly illustrated in FIG. 8, flow from the gates to the emitters of the respective switching devices 2u and 2d through the control terminals 23. In other words, the current flows from the control terminal 23G into the semiconductor module 2 and then goes out of the control terminal 23E. This creates, as illustrated in FIG. 9, the current loops i2 through the control terminals 23. The outer shell protrusion 32 are, as described above, arranged to face the control terminals 23, thereby causing an eddy current, as created in the outer shell protrusion 32, to cancel magnetic fluxes, as developed by the current loops i2 in the control terminals 23, which results in a decrease in inductance of the power terminals 23.

Beneficial advantages, as offered by the above embodiment, will be described below.

The electrical power conversion device 1 is, as described above, designed to have the outer shell protrusions 32 overlapping the power terminals 22 and the control terminals 23 in the stacking direction X. This, as described already, causes the outer shell protrusions 32 to develop eddy currents when the current flows through the power terminals 22 and the control terminals 23. The eddy currents serve to cancel the magnetic fluxes arising from the current loops, thereby resulting in a decrease in inductance of the power terminals 22 and the control terminals 23 facing the outer shell protrusions 32.

The outer shell protrusions 32 are formed by portions of the outer shell plates 31 of each of the cooling pipes 3. In other words, the outer shell protrusions 32 are arranged close to the power terminals 22 and the control terminals 23 in the stacking direction X. Each of the outer shell plates 31 constituting the cooling pipe 3 is designed to have a relatively large thickness. The outer shell protrusions 32 made of portions of the outer shell plates 31, thus, have a relatively great thickness, thereby ensuring a desired mechanical strength of the outer shell protrusions 32. This minimizes a risk of undesirable deformation of the outer shell protrusions 32, which improves the productivity of the electrical power conversion device 1.

The widths ha and hb of the outer shell protrusions 32 that are, as shown in FIG. 6, dimensions or distances between outer side walls of the flow-path defining portion 311 and outer edges of the outer shell protrusions 32 are, as described above, selected to be greater than the width k of each of the circumferential side portions 33 of the flow-path outer periphery 312. This minimizes the dimension of the cooling pipes 3 in the lateral direction Y. In other words, the outer shell protrusions 32 do not result in an increase in dimension of the cooling pipes 3 in the lateral direction Y, thereby facilitating the ease with which the electrical power conversion device 1 is reduced in size thereof.

The outer shell plate 31 has the outer shell protrusions 32 extending both in the opposite height-wise directions Z. The upper outer shell protrusion 32a is laid to overlap the power terminals 22 in the stacking direction X, while the lower outer shell protrusion 32b is laid to overlap the control terminals 23 in the stacking direction X.

The outer shell plates 31 which form a pair both are equipped with the outer shell protrusions 32 whose major surfaces face each other in the stacking direction X. This enables each of the outer shell protrusions 32 of the cooling pipes 3 to be arranged close to the power terminals 22 or the control terminals 23 on either side of each of the semiconductor modules 2 in the stacking direction X.

Each of the cooling pipes 3 is equipped with the intermediate plate 34 which is firmly held between the flow-path outer peripheries 312 of the pair of the outer shell plates 31, thereby improving the cooling ability of the cooling pipe 3 and enhancing the mechanical strength of the cooling pipe 3.

The intermediate plate 34 is equipped with the intermediate protrusions 341 whose major surfaces are laid on or overlap with the outer shell protrusions 32, thereby reinforcing the mechanical strength of the outer shell protrusions 32.

The widths ha and hb of the outer shell protrusions 32 are greater than the thickness d of the cooling pipe 3 in the stacking direction X. This enhances the ability of the outer shell protrusions 32 to decrease the inductance of the power terminals 22 and the control terminals 23.

The width k of each of the circumferential side portions 33 of the flow-path outer periphery 312 is smaller than the thickness d of the cooling pipe 3, thereby enabling the dimension of the cooling pipe 3 to be decreased in the lateral direction Y. This facilitates the ease with which the size of the electrical power conversion device 1 is decreased.

As apparent from the above discussion, the electrical power conversion device 1 is designed to decrease the inductance of the power terminals 22 and/or the control terminals 23, improve the productivity thereof, and enable the size thereof to be reduced.

Second Embodiment

Figure 10:
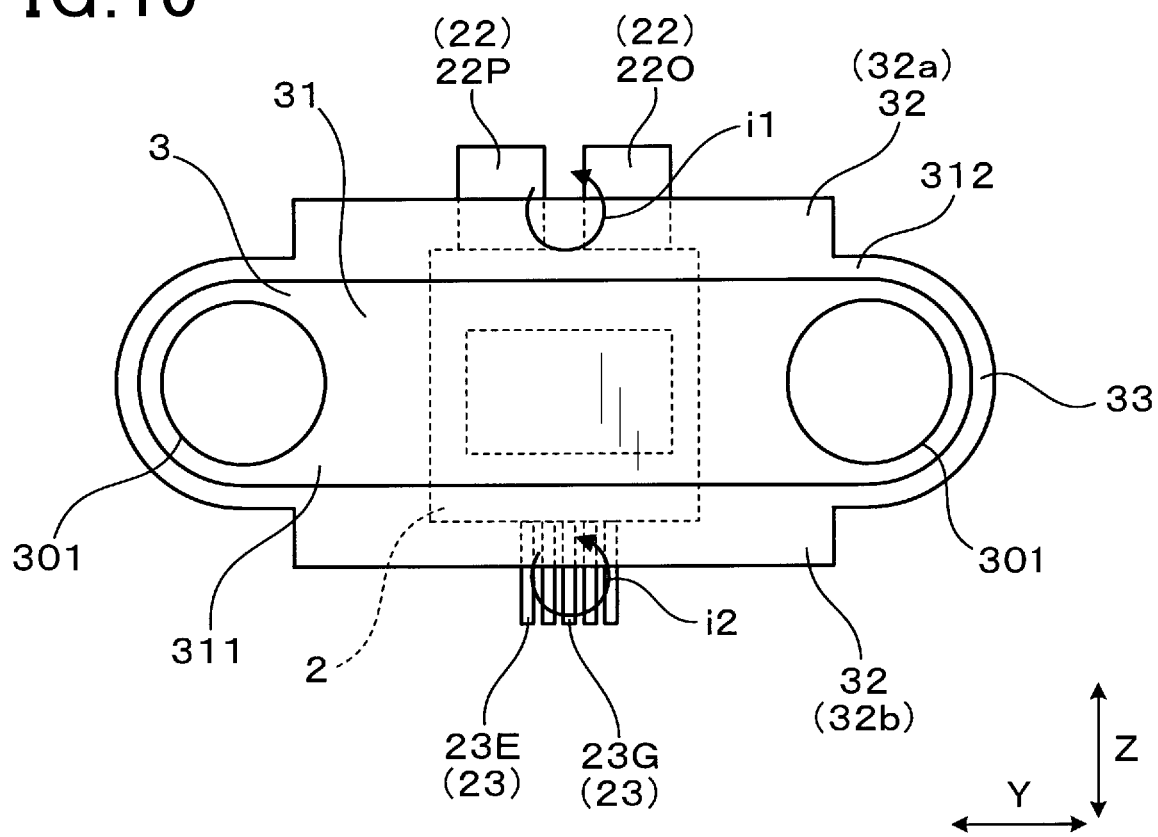
FIG. 10 is a front view which illustrates a semiconductor module and a cooling pipe in the second embodiment.
Figure 11:
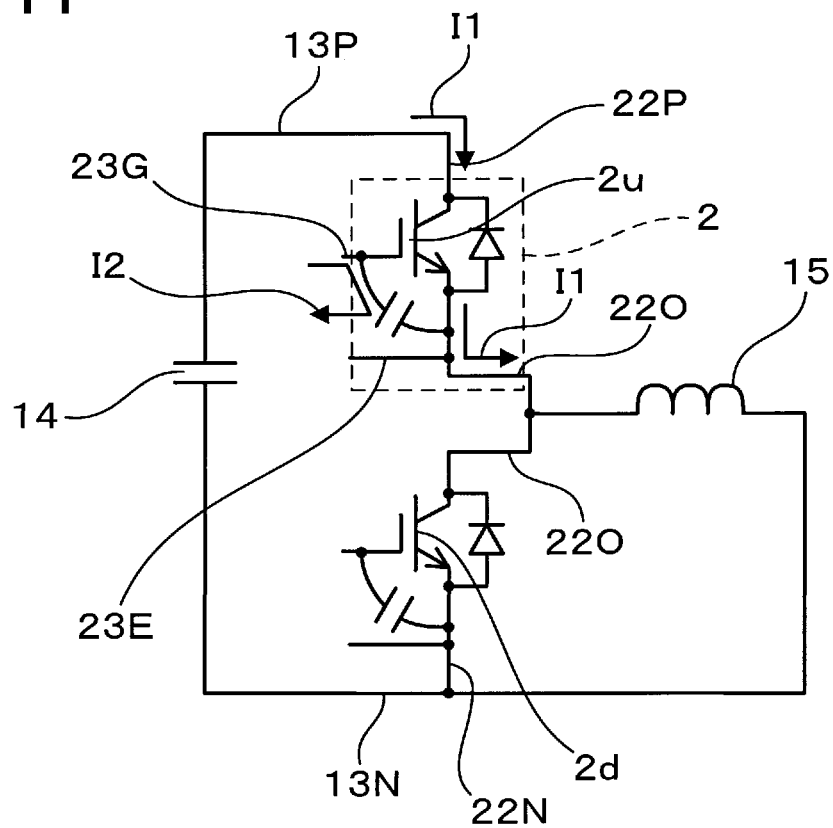
FIG. 11 is a circuit diagram which partially illustrates a circuit structure of an electrical power conversion device in the second embodiment.

FIGS. 10 and 11 illustrate the electrical power conversion device 1 according to the second embodiment in which each of the semiconductor modules 2 has a single switching device installed therein.

The semiconductor module 2 is equipped with two power terminals 22. Some of the semiconductor modules 2 of the electrical power conversion device 1 each have the upper arm switching device 2u installed therein, while the other semiconductor modules 2 each have the lower arm switching device 2d installed therein.

Each of the semiconductor modules 2 in which the upper arm switching devices 2u are installed is equipped with the power terminals 22 which include the power terminal 22P and the power terminal 22O. The power terminal 22P is connected to the high-potential bus bar 13P. The power terminal 22O is connected to the output bus bar 13O. Each of the semiconductor modules 2 in which the lower arm switching devices 2d are installed is equipped with the power terminals 22 which include a power terminal (not shown) connected to the low-potential bus bar 13N and a power terminal (not shown) connected to the output bus bar 13O. The semiconductor modules 2 all have substantially the same structure.

The reduction in inductance achieved by the semiconductor modules 2 with the upper arm switching devices 2u will be described below. Now, consider, like in the first embodiment, an alternating current component I1 of a controlled current varying in a closed loop, as illustrated in FIG. 11, made up of the upper arm switching device 2u, the lower arm switching device 2d connected in series with the upper arm switching device 2u, and the smoothing capacitor 14. The alternating current component I1 enters the upper arm semiconductor module 2 at the power terminal 22P and then leaves the power terminal 22O. The alternating current component I1 flows in mutual opposite directions in the power terminal 22P and the power terminal 22O arranged adjacent each other. This, as demonstrated in FIG. 10, creates a current loop i1 including the power terminals 22P and 22O.

The outer shell protrusion 32a is oriented to overlap the power terminals 22P and 22O in the stacking direction X. This causes an eddy current to be created in the outer shell protrusion 32a to cancel a magnetic flux, as developed in the current loop i1, which results in a decrease in inductance of the power terminals 22.

Similarly, the semiconductor module 2 with the lower arm switching device 2d creates a current loop i2 including the two power terminals 22. The outer shell protrusion 32b functions in the same way as the outer shell protrusion 32a to reduce the inductance of the control terminals 23.

Other arrangements are identical with those in the first embodiment, and explanation thereof in detail will be omitted here. In the second and following embodiments, the same reference numbers, as employed in the preceding embodiment, refer to the same parts unless otherwise specified.

The electrical power conversion device 1 of the second embodiment, like in the first embodiment, has the ability to reduce the inductance of the power terminals 22 and/or the control terminals 23 and also offers substantially the beneficial advantages as in the first embodiment.

Third Embodiment

Figure 12:
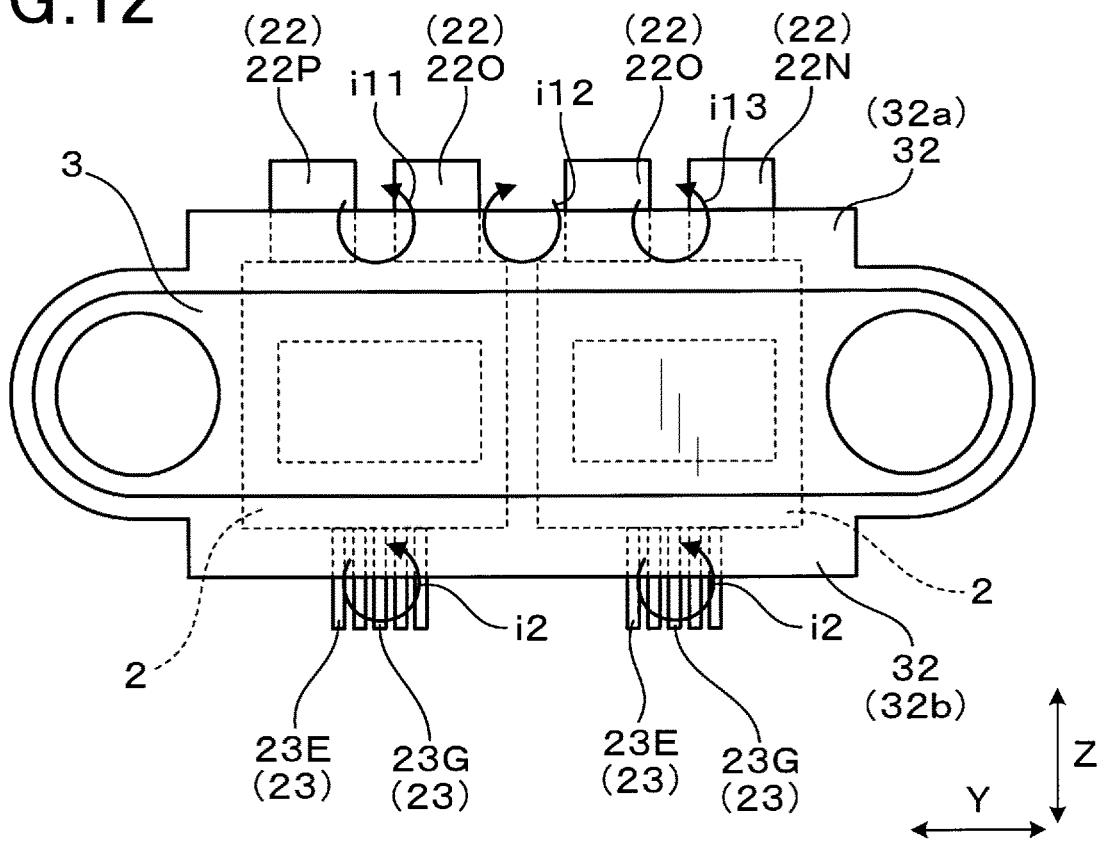
FIG. 12 is a front view which illustrates a semiconductor module and a cooling pipe in the third embodiment.
Figure 13:
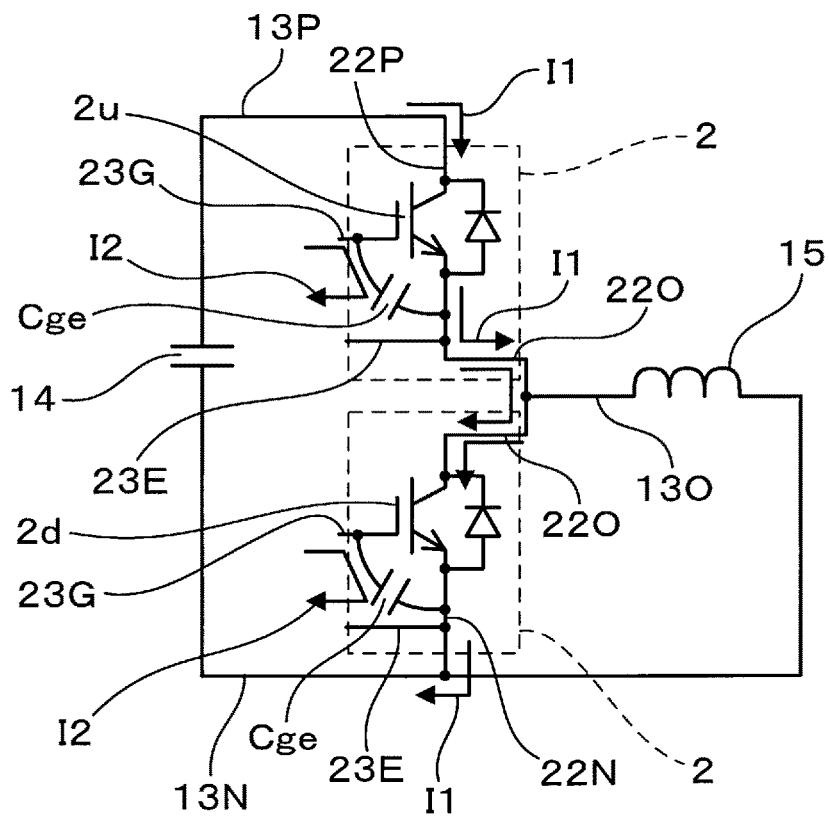
FIG. 13 is a circuit diagram which partially illustrates a circuit structure of an electrical power conversion device in the third embodiment.

FIGS. 12 and 13 illustrate the electrical power conversion device 1 of the third embodiment in which each of the semiconductor modules 2 has a single switching device installed therein, and each two of the semiconductor modules 2 are arranged adjacent each other in the lateral direction Y.

The electrical power conversion device 1 also has the cooling pipes 3 every two of which hold the two semiconductor modules 2 in the stacking direction X which are disposed adjacent each other in the lateral direction Y.

Two of the semiconductor modules 2 which are arranged adjacent each other in the lateral direction Y respectively have the upper arm switching device 2u and the lower arm switching device 2d connected in series. The adjacent semiconductor modules 2 are arranged to have the power terminals 22O which are connected to the output bus bar 13O and disposed close to each other in the lateral direction Y. Each of the power terminal 22P leading to the high-potential bus bar 13P and the power terminal 22N leading to the low-potential bus bar 13N is located outside one of the power terminals 22O. In other words, the power terminals 22O, 22P, and 22N are aligned in the lateral direction Y.

Consider, like in the first embodiment, an alternating current component I1 of a controlled current varying in a closed loop, as illustrated in FIG. 13, made up of the upper arm switching device 2u, the lower arm switching device 2d connected in series with the upper arm switching device 2u, and the smoothing capacitor 14. The alternating current component I1 flows out of the power terminal 22P of the upper arm semiconductor module 2 and then enters the power terminal 22O of the upper arm semiconductor module 2. Subsequently, the alternating current component I1 flows out of the power terminal 22O of the lower arm semiconductor module 2 and then enters the power terminal 22N of the lower arm semiconductor module 2. Therefore, the alternating current component I1 flows in mutual opposite directions in the power terminal 22P and the power terminal 22O of the upper arm semiconductor module 2. Similarly, the alternating current component I1 flows in mutual opposite directions in the power terminal 22O of the upper arm semiconductor module 2 and the power terminal 22O of the lower arm semiconductor module 2. Further, the alternating current component I1 flows in mutual opposite directions in the power terminal 22O and the power terminal 22N of the lower arm semiconductor module 2. This, as clearly illustrated in FIG. 12, creates current loops i11, i12, and i13 each of which includes the adjacent power terminals 22.

The outer shell protrusion 32 is arranged to overlap all the four power terminals 22 in the stacking direction X. The eddy current is, thus, created in the outer shell protrusion 32 to cancel magnetic fluxes developed by the current loops i11, i12, and i13, thereby decreasing the inductance of the power terminals 22.

The electrical power conversion device 1 of the third embodiment, like in the first embodiment, has the ability to reduce the inductance of the power terminals 22 and/or the control terminals 23 and also offers substantially the beneficial advantages as in the first embodiment.

Fourth Embodiment

Figure 14:
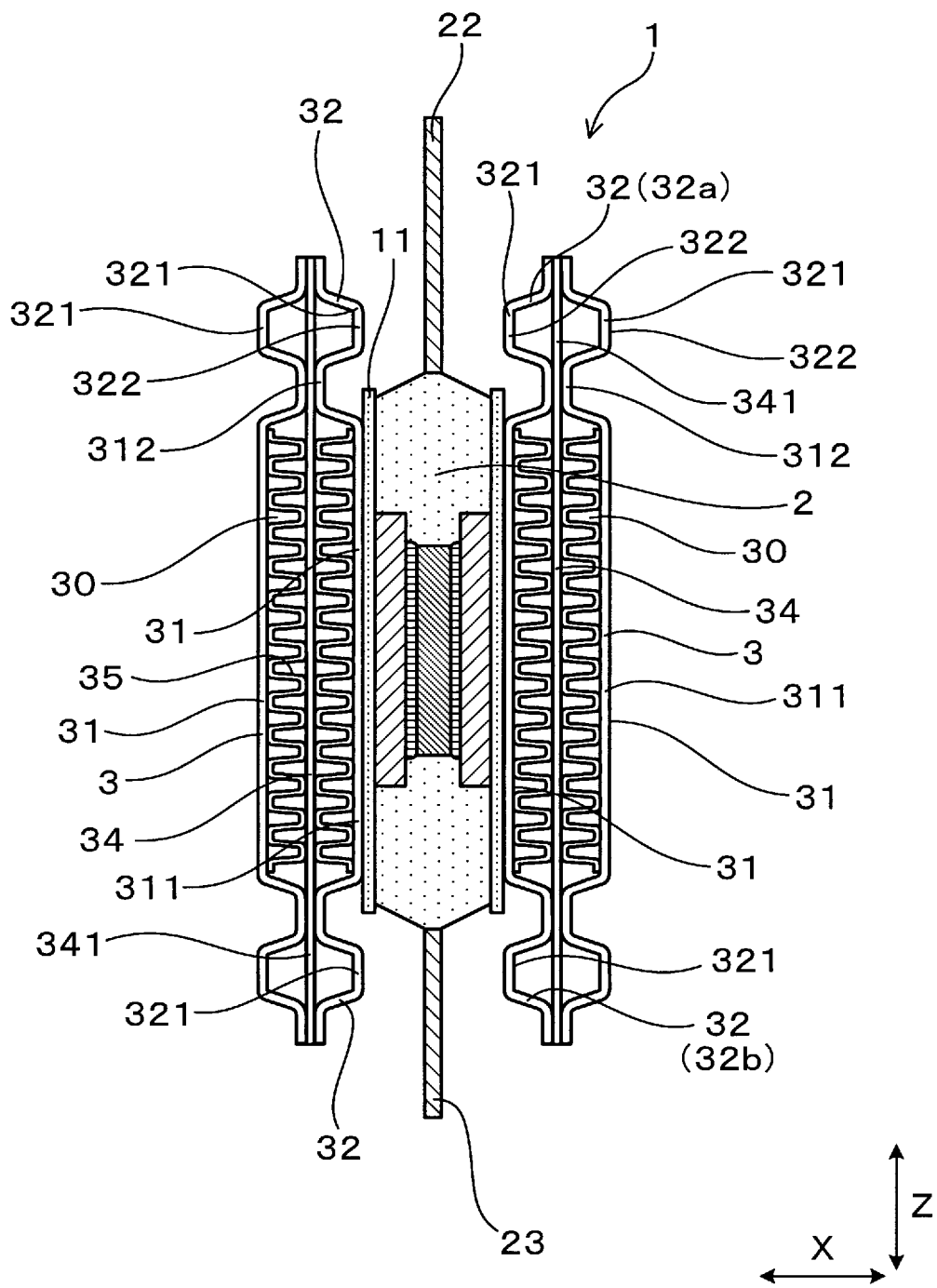
FIG. 14 is a partially sectional view which illustrates an electrical power conversion device in the fourth embodiment.
Figure 15:
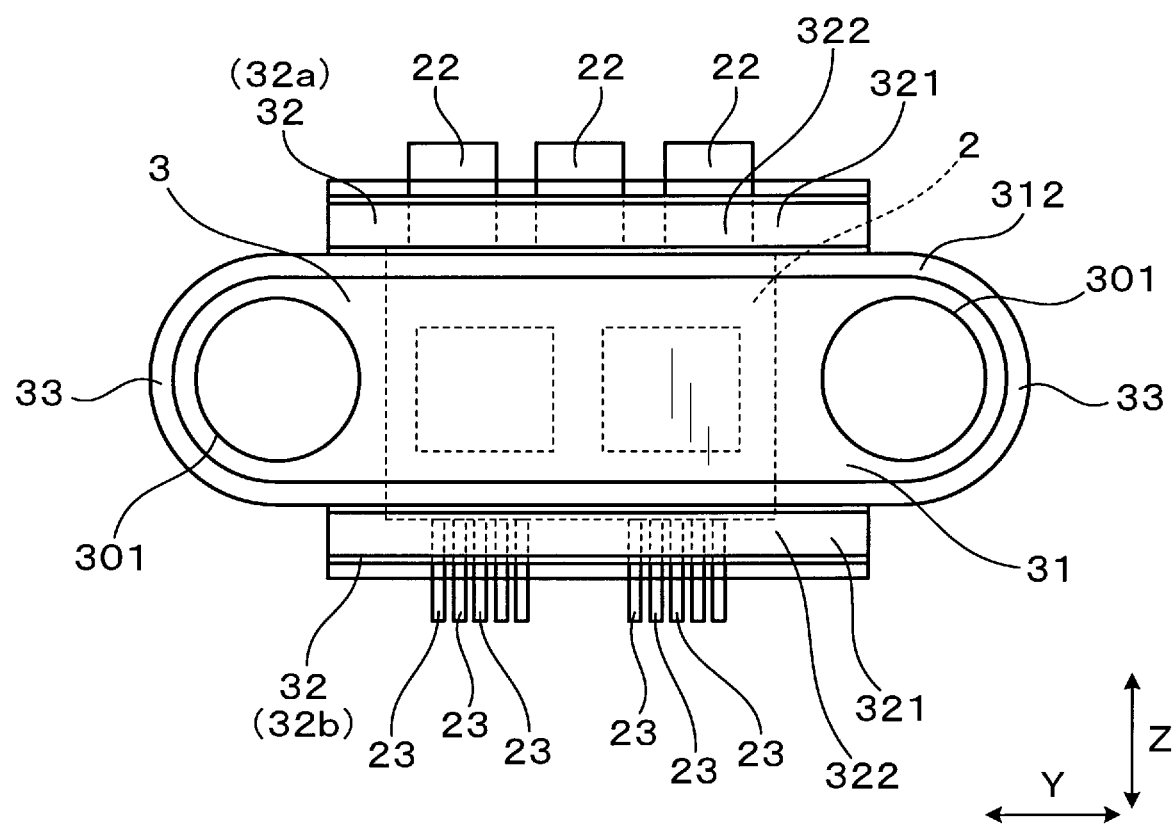
FIG. 15 is a front view which illustrates a semiconductor module and a cooling pipe in the fourth embodiment.

FIGS. 14 and 15 illustrates the electrical power conversion device 1 according to the fourth embodiment in which each of the outer shell protrusions 32 has the portion 321 bulging toward one of the semiconductor modules 2 in the stacking direction X. When viewed in the stacking direction X, each of the bulging portions 321 overlaps the power terminals 22 or the control terminals 23.

The bulging portion 321 is formed on each of the outer shell protrusion 32a extending upward from the outer shell plate 31 and the outer shell protrusion 32b extending downward from the outer shell plate 31. The bulging portions 321 are also formed on two of the outer shell protrusions of each of the cooling pipes 3 which overlap each other in the stacking direction X. The bulging portions 321 of every two of the outer shell protrusions 32 overlapping each other in the stacking direction X bulge in opposite directions when viewed from the intermediate plate 34. In other words, the bulging portions 321 of every pair of the outer shell protrusions 32 rise toward the two semiconductor modules 2 disposed adjacent each other through the cooling pipe 3 in the stacking direction X.

Each of the bulging portions 321 includes the flat wall 322 extending perpendicular to the stacking direction X. Each of the flat walls 322 faces or overlaps the power terminals 22 or the control terminals 23 in the stacking direction X.

Each of the intermediate protrusions 341 of the intermediate plate 34 is, as can be seen in FIG. 14, disposed between two of the bulging portions 321 which overlap each other in the stacking direction X. A void space (i.e., an air chamber) is created between the bulging portion 321 and the intermediate protrusion 341. The void space is fluidly isolated from the coolant flow path 30, so that no cooling medium flows in the void space.

A joint of each of the outer shell plates 31 and the intermediate plate 34 continuously extends between the flow-path defining portion 311 and the bulging portion 321. Each of the outer shell protrusions 32 has an end which is formed outside the bulging portion 321 in the height-wise direction Z and placed in contact with the surface of the intermediate protrusion 341. The end of the outer shell protrusion 32 needs not be joined directly to the intermediate protrusion 341 and may alternatively be disposed away from the intermediate protrusion 341.

Each of the bulging portions 321 is designed not to protrude beyond the insulator 11 toward the semiconductor module 2 in the stacking direction X. In other words, each of the outer shell protrusions 32 lies flush with the surface of the flow-path defining portion 311 which faces the semiconductor module 2 in the stacking direction X, that is, in alignment with the surface of the flow-path defining portion 311 in the height-wise direction Z or is disposed farther away from the semiconductor module 2 than from the surface of the flow-path defining portion 311. To explain this in another way, the outer shell protrusion 32 is formed not to lie beyond the flow-path defining portion 311 closer to the semiconductor module 2 in the stacking direction X.

Other arrangements are identical with those in the first embodiment.

The outer shell protrusion 32 in the fourth embodiment, as described above, has the bulging portions 321, so that the outer shell protrusion 32 is located closer to the power terminals 22 or the control terminals 23 than in the above embodiments. This enhances the reduction in inductance of the power terminals 22 and the control terminals 23.

The outer shell protrusion 32, as described above, lies flush with the surface of the flow-path defining portion 311 which faces the semiconductor module 2 in the stacking direction X or is disposed farther away from the semiconductor module 2 than from the surface of the flow-path defining portion 311 in the stacking direction X, thereby ensuring a required degree of insulation between the outer shell protrusion 32 and the power terminals 22 or the control terminals 23.

The electrical power conversion device 1 of the fourth embodiment also offers substantially the beneficial advantages as in the first embodiment.

Fifth Embodiment

Figure 16:
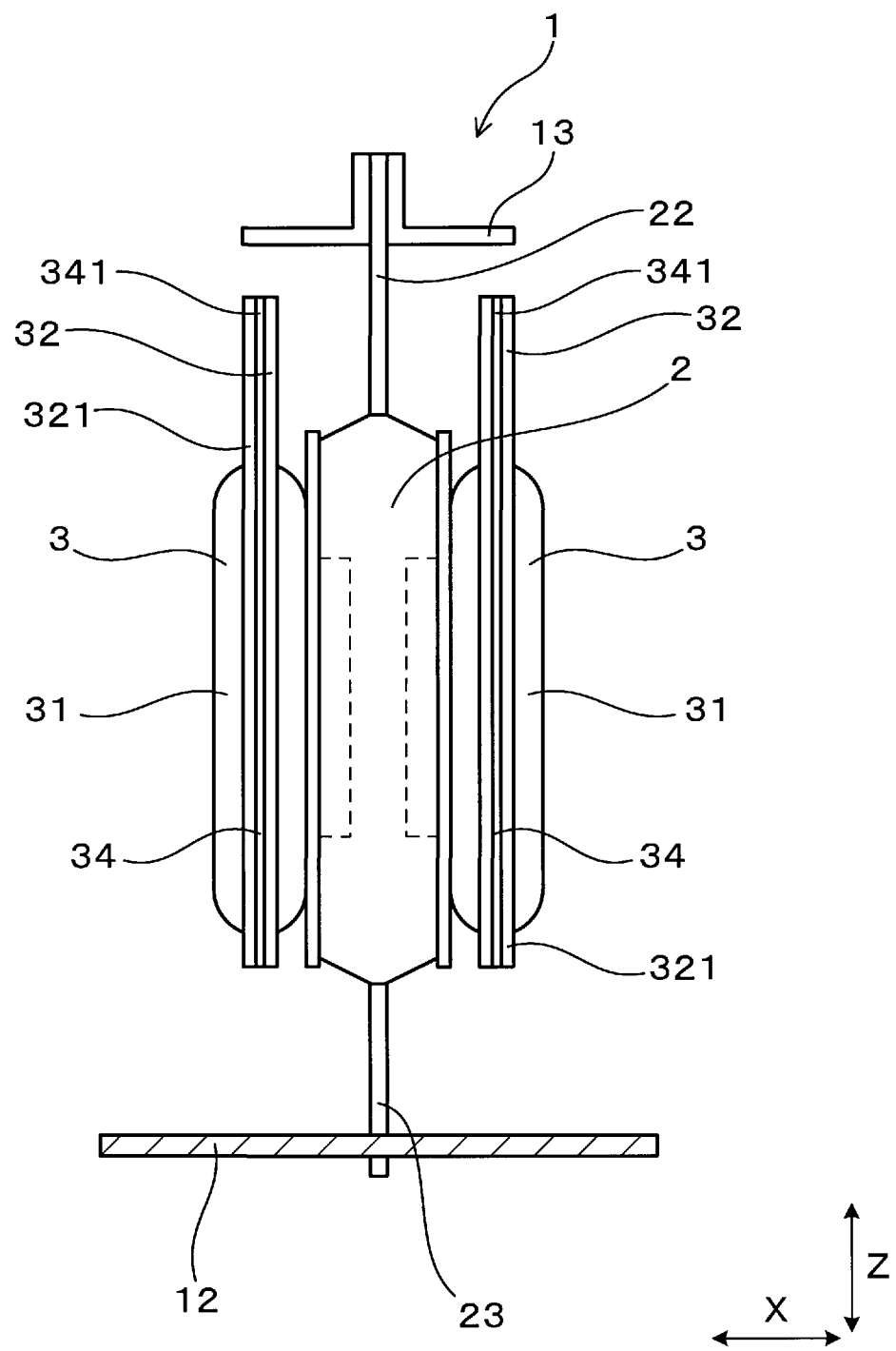
FIG. 16 is a partially sectional view which illustrates an electrical power conversion device in the fifth embodiment.

FIG. 16 illustrates the electrical power conversion device 1 according to the fifth embodiment in which each of the outer shell plates 31 has only the upper outer shell protrusion 32. In other words, the outer shell plate 31 is equipped only with the outer shell protrusion 32 facing the power terminals 22 in the stacking direction X, but does not have the outer shell protrusion 32 facing the control terminals 23.

Other arrangements are identical with those in the first embodiment, and explanation thereof in detail will be omitted here.

The outer shell plate 31 is equipped with only the upper outer shell protrusion 32 in the height-wise direction Z, thereby facilitating the ease with which the electrical power conversion device 1 is reduced in size or weight thereof. The outer shell protrusion 32 are laid to overlap the power terminals 22 through which a greater electrical current flows, thus ensuring beneficial effects achieved by the reduction in inductance of the power terminals 22.

The electrical power conversion device 1 of the fifth embodiment also offers substantially the beneficial advantages as in the first embodiment.

سixth Embodiment

Figure 17:
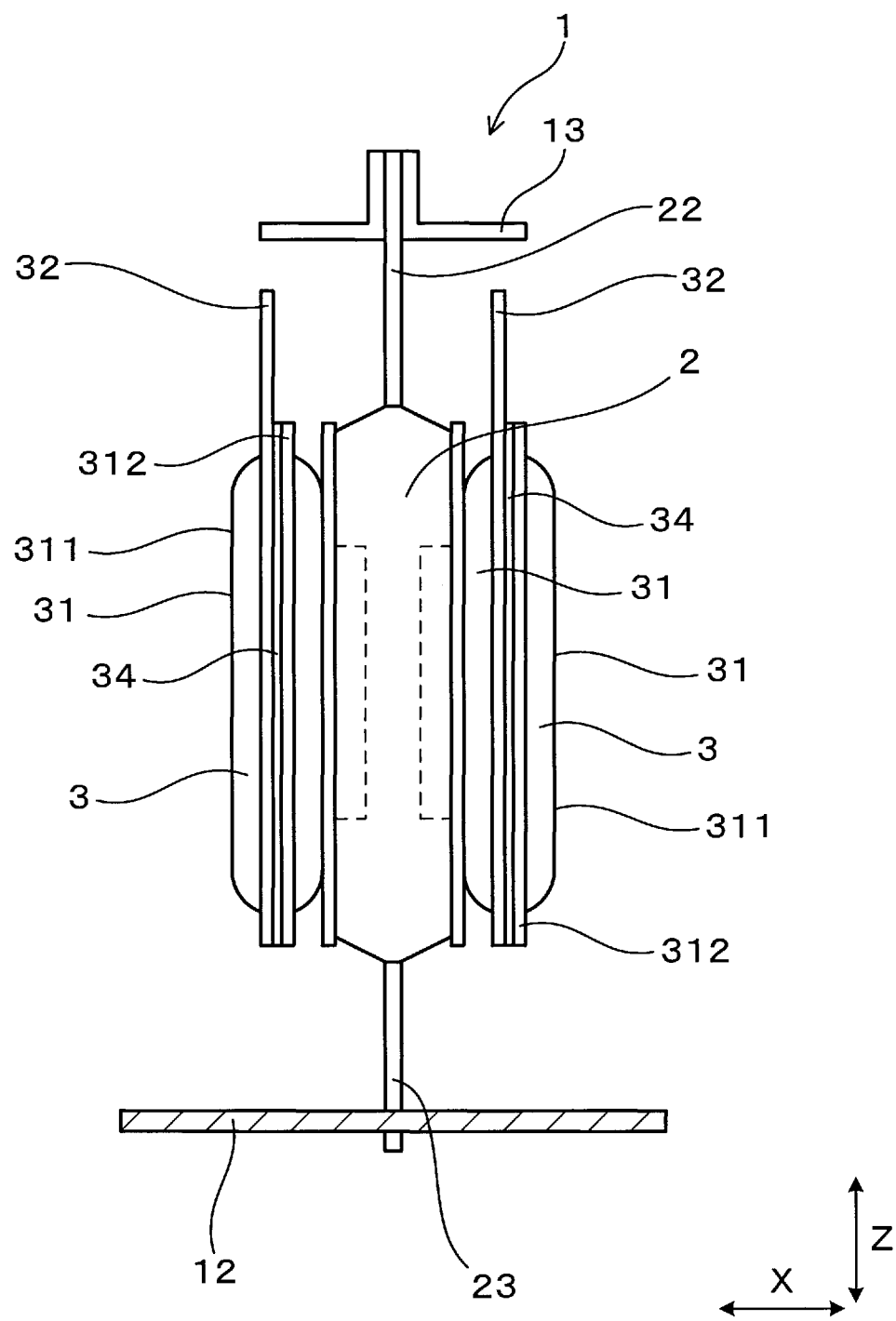
FIG. 17 is a partially sectional view which illustrates an electrical power conversion device in the sixth embodiment.

FIG. 17 illustrates the electrical power conversion device 1 according to the sixth embodiment in which only one of the two outer shell plates 31 of each of the cooling pipes 3 has the outer shell protrusion 32.

One of the pair of the outer shell plates 31 of each of the cooling pipes 3 is designed not to have the outer shell protrusion 32.

Specifically, in one (which will also be referred to below as a first cooling pipe) of the two adjacent cooling pipes 3 between which each of the semiconductor modules 2 is retained (i.e., a right one of the cooling pipes 3 in the example of FIG. 17), one of the outer shell plates 31 (i.e., a left one of the outer shell plates 31 in FIG. 17) which is closer to the semiconductor module 2 has the outer shell protrusion 32. In other words, of the outer shell plates 31 of one of every two of the cooling pipes 3 which are disposed adjacent each other through one (which will also be referred to as a first semiconductor module) of the semiconductor modules 2, one (which will also be referred to below as a first outer shell plate or an inside outer shell plate) closer to the first semiconductor module 2 has the outer shell protrusion 32.

In other words, of the outer shell plates 31 of one (i.e., a left one of the cooling pipes 3 in FIG. 17 which will also be referred to below as a second cooling pipe) of the cooling pipes 3, one (which will also be referred to below as a second outer shell or an outside outer shell plate) farther from the first semiconductor module 2 has the outer shell protrusion 32. Each of the intermediate plates 34 is shaped not to have the intermediate protrusion 341 which is illustrated in FIG. 16.

Other arrangements are identical with those in the fifth embodiment, and explanation thereof in detail will be omitted here.

The configuration of the cooling pipes 3 of this embodiment reduces the weight or the cost of material of the cooling pipes 3.

The electrical power conversion device 1 of the sixth embodiment also offers substantially the beneficial advantages as in the fifth embodiment.

Seventh Embodiment

Figure 18:
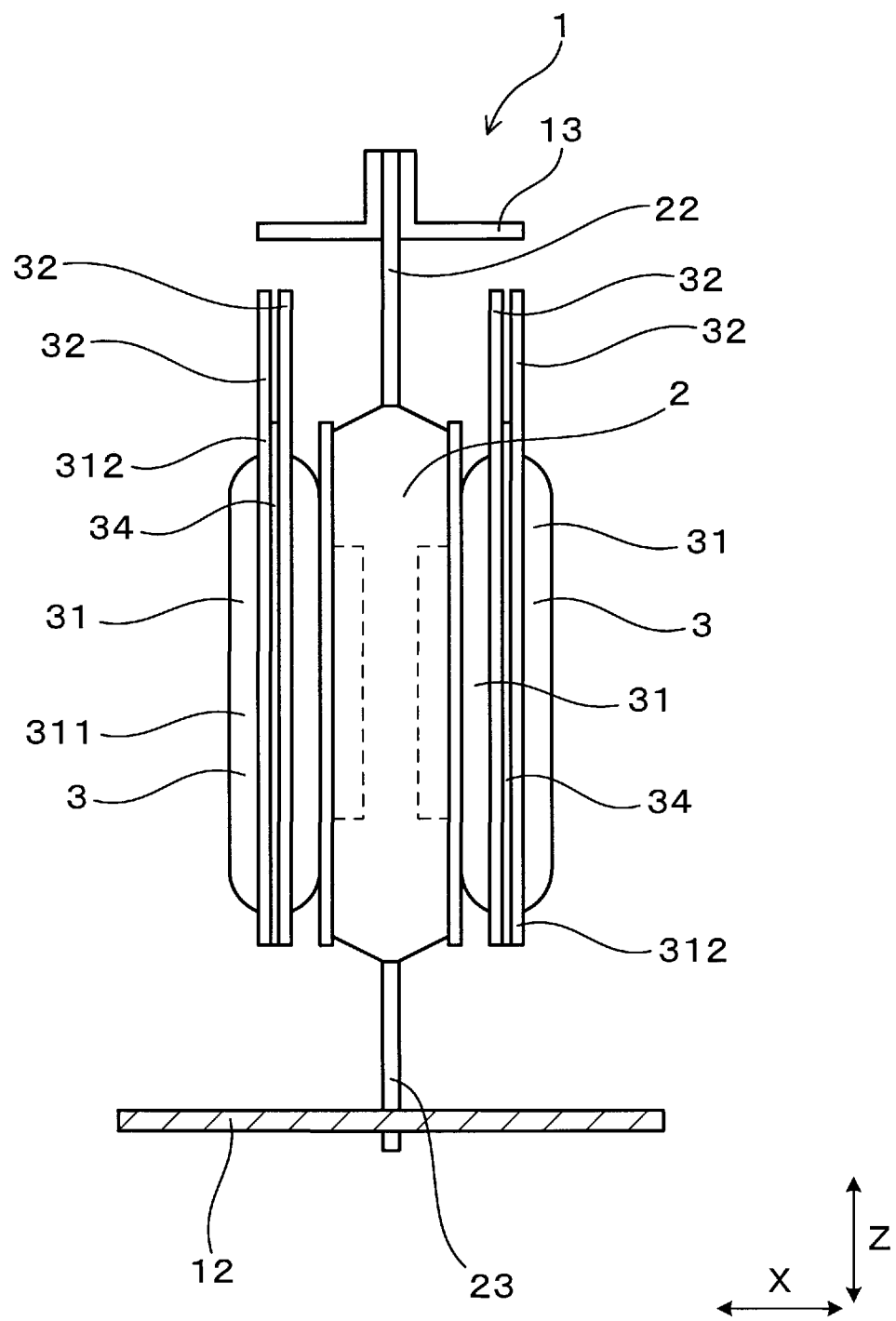
FIG. 18 is a partially sectional view which illustrates an electrical power conversion device in the seventh embodiment.

FIG. 18 illustrates the electrical power conversion device 1 according to the seventh embodiment which is a modification of the fifth embodiment in FIG. 16 and in which each of the intermediate plates 34 is shaped not to have the intermediate protrusion 341.

The two outer shell plates 31 of each of the cooling pipes 3 both have the upper outer shell protrusion 32. The intermediate plate 34, however, does not have the intermediate protrusion 341. The outer shell plates 31 of each of the cooling pipes 3 are laid to overlap or face each other in the stacking direction X through an air gap equivalent to the thickness of the intermediate plate 34.

Other arrangements are identical with those in the fifth embodiment, and explanation thereof in detail will be omitted here.

The absence of the intermediate protrusions in the cooling pipes 3 of this embodiment reduces the weight or the cost of material of the cooling pipes 3.

The electrical power conversion device 1 of the seventh embodiment also offers substantially the beneficial advantages as in the fifth embodiment.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

For instance, each of the cooling pipes 3 may be designed not to have the intermediate plate 34.

Figure 19:
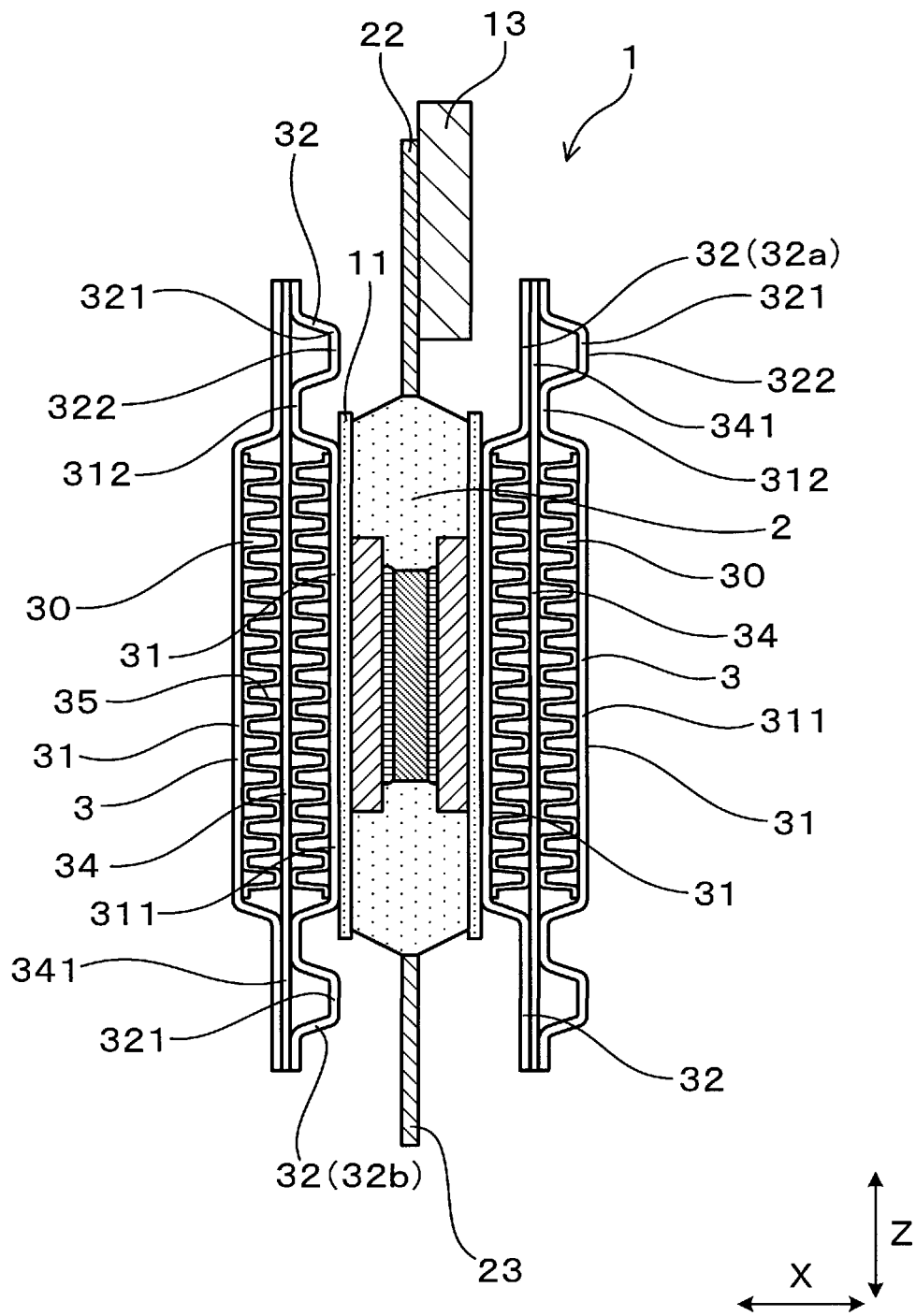
FIG. 19 is a partially sectional view which illustrates a modified form of an electrical power conversion device.

The outer shell protrusions 32 of each of the cooling pipes 3 in the fourth embodiment illustrated in FIG. 14 are equipped with the bulging portions 321 overlapping each other in the stacking direction X, but however, only one of the outer shell protrusions 32 may be designed, as illustrated in FIG. 19, to have the bulging portions 321. Specifically, in a case where the bus bar 13 is disposed between the power terminal 22 and the outer shell protrusion 32, the need usually arises to keep enough space between the bus bar 13 and the outer shell protrusion 32 for ensuring a required degree of electrical insulation therebetween. One of the outer shell protrusions 32 which is closer to the opposite side of the power terminal 22 to the bus bar 13 may, therefore, be shaped to have the bulging portion 321 to place the outer shell protrusion 32 close to the power terminal 22 in order to reduce the inductance of the power terminal 22.

In the example of FIG. 19, each of the upper outer shell protrusion 32*a* and the lower outer shell protrusion 32*b* has the bulging portion 321 facing in only one of the stacking directions X, but however, the lower outer shell protrusions 32*b* may be shaped to have the bulging portions 321 rising in both of the stacking directions X.

Figure 20:
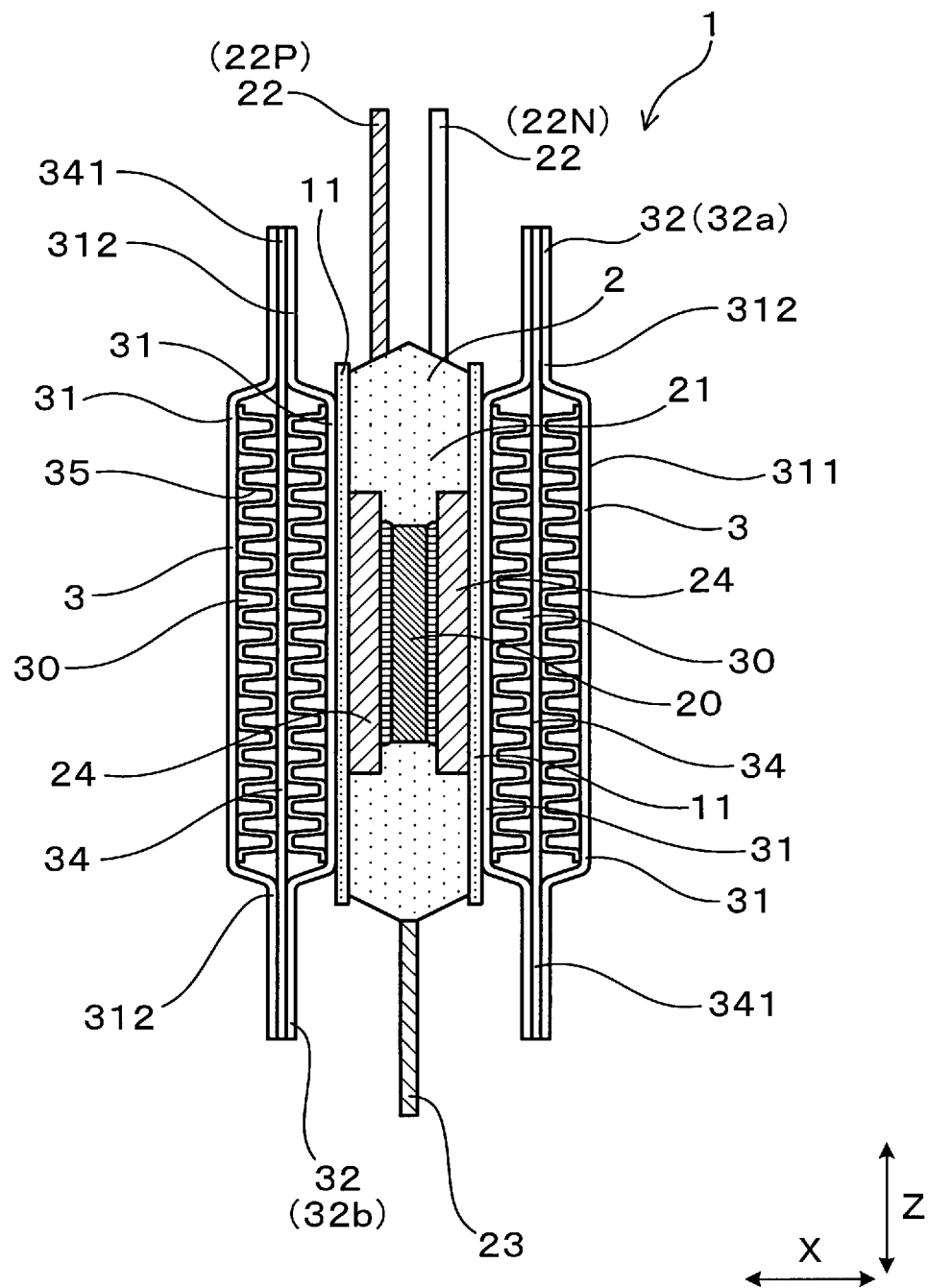
FIG. 20 is a partially sectional view which illustrates a modified form of an electrical power conversion device.

In the first embodiment, the power terminals 22 of each of the semiconductor modules 2 are, as illustrated in FIGS. 2 to 4, arrayed in line in the lateral direction Y, but however, they may alternatively be, as illustrated in FIG. 20, arranged out of alignment with each other in the lateral direction Y, in other words, offset from each other in the stacking direction X. Specifically, in the modification of FIG. 20, the power terminals 22 of each of the semiconductor modules 2 are arrayed adjacent to each other in the lateral direction Y, but offset from each other in the stacking direction X. For instance, the power terminal 22P and the power terminal 22N are, as demonstrated in FIG. 20, disposed at a given interval away from each other in the stacking direction X. The power terminal 22O may be aligned with the power terminal 22P in the lateral direction Y. These arrangements result in a decreased interval between each of the power terminals 22 and an adjacent one of the outer shell protrusions 32.

What is claimed is:

1. An electrical power conversion apparatus comprising:
   a semiconductor module which includes a module body in which a semiconductor device is installed, a plurality of power terminals extending from the module body, and a plurality of control terminals extending from the module body, the module body having major surfaces including a first major surface and a second major surface;
   a first cooling pipe and a second cooling pipe which are stacked on each other through the semiconductor module and hold the major surfaces of the module body between the first cooling pipe and the second cooling pipe;
   a first insulator disposed between the first major surface and the first cooling pipe; and
   a second insulator disposed between the second major surface and the second cooling pipe,
   wherein the power terminals protrude from a portion of the module body that is sandwiched between the first insulator and the second insulator,
   wherein the power terminals extend from the module body in a first height-wise direction that is one of height-wise directions perpendicular to a stacking direction in which the first and second cooling pipes and the semiconductor module are stacked,
   wherein the control terminals extend from the module body in a second height-wise direction that is one of the height-wise directions,
   wherein each of the first and second cooling pipes includes a first outer shell plate and a second outer shell plate which are electrically conductive and face each other in the stacking direction, the first and second outer shell plates forming a coolant flow path therebetween,
   wherein each of the first and second outer shell plates includes a flow-path defining portion which defines the coolant flow path and a flow-path outer periphery which forms an outer circumference of the flow-path defining portion, as viewed in the stacking direction,
   wherein the flow-path outer periphery of at least one of the first and second outer shell plates includes an outer shell protrusion located on one of sides of the flow-path defining portion in the height-wise directions,
   wherein the outer shell protrusion has a protruding dimension that is a distance between an outer edge of the outer shell protrusion and an outer edge of the flow-path defining portion is selected to be greater than a protruding dimension of a circumferential side portion of the flow-path outer periphery which protrudes outwardly from the flow-path defining portion in a lateral direction perpendicular to the height-wise directions and the stacking direction, and
   wherein the outer shell protrusion is laid to overlap, in the stacking direction, a portion of each of the power terminals that protrudes from the module body.

2. The electrical power conversion apparatus as set forth in claim 1, wherein each of the power terminals and each of the control terminals of the semiconductor module extend away from each other from the module body in the height-wise directions, wherein the outer shell protrusion extends from the flow-path defining portion in a direction in which the power terminals extend and is laid to overlap the power terminals in the stacking direction.

3. The electrical power conversion apparatus as set forth in claim 1, wherein the flow-path outer periphery of at least one of the first and second outer shell plates includes a first outer shell protrusion and a second outer shell protrusion which protrude away from each other in the height-wise directions, the first outer shell protrusion being laid to overlap the power terminals in the stacking direction, the second outer protrusion being laid to overlap the control terminals in the stacking direction.

4. The electrical power conversion apparatus as set forth in claim 1, wherein the flow-path outer peripheries of the first and second outer shell plates include outer shell protrusions which face each other in the stacking direction.

5. The electrical power conversion apparatus as set forth in claim 1, wherein each of the first and second cooling pipes is equipped with an intermediate plate disposed in the first and second outer shell plates, the intermediate plate being held by the flow-path outer peripheries of the first and second outer shell plates.

6. The electrical power conversion apparatus as set forth in claim 5, wherein the intermediate plate has an intermediate protrusion overlapping the outer shell protrusion.

7. The electrical power conversion apparatus as set forth in claim 1, wherein the outer shell protrusion has a bulging portion which rises toward the semiconductor module, the bulging portion overlapping the power terminals or the control terminals in the stacking direction.

8. The electrical power conversion apparatus as set forth in claim 1, wherein the protruding dimension of the outer shell protrusion is greater than a thickness of the first and second cooling pipes, as defined in the stacking direction.

9. The electrical power conversion apparatus as set forth in claim 1, wherein the protruding dimension of the circumferential side portion of the flow-path outer periphery is smaller than a thickness of the first and second cooling pipes in the stacking direction.

10. The electrical power conversion apparatus as set forth in claim 1, wherein the outer shell protrusion substantially lies flush with a surface of the flow-path defining portion which faces the semiconductor module in the stacking direction or is located farther away from the semiconductor module than from the surface of the flow-path defining portion in the stacking direction.

11. The electrical power conversion apparatus as set forth in claim 1, wherein
the power terminals include a positive terminal and a negative terminal, and
the positive terminal and the negative terminal overlap the outer shell protrusion.

* * * * *